US 7,225,047 B2

(12) United States Patent
Al-Bayati et al.

(10) Patent No.: US 7,225,047 B2
(45) Date of Patent: May 29, 2007

(54) METHOD, SYSTEM AND MEDIUM FOR CONTROLLING SEMICONDUCTOR WAFER PROCESSES USING CRITICAL DIMENSION MEASUREMENTS

(75) Inventors: Amir Al-Bayati, Gilroy, CA (US); Babak Adibi, Los Altos, CA (US); Majeed Foad, Sunnyvale, CA (US); Sasson Somekh, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/100,184

(22) Filed: Mar. 19, 2002

(65) Prior Publication Data

US 2003/0180972 A1    Sep. 25, 2003

(51) Int. Cl.
*G06F 19/00* (2006.01)
*G01N 37/00* (2006.01)

(52) U.S. Cl. .............. 700/121; 700/109; 700/110; 702/82; 702/84

(58) Field of Classification Search ........ 700/109–110, 700/117, 119–121; 438/5, 14; 702/81–84
See application file for complete search history.

(56) References Cited

U.S. PATENT DOCUMENTS

| | | | |
|---|---|---|---|
| 3,205,485 A | 9/1965 | Noltingk | |
| 3,229,198 A | 1/1966 | Libby | |
| 3,767,900 A | 10/1973 | Chao et al. | |
| 3,920,965 A | 11/1975 | Sohrwardy | |
| 4,000,458 A | 12/1976 | Miller et al. | |
| 4,207,520 A | 6/1980 | Flora et al. | |
| 4,209,744 A | 6/1980 | Gerasimov et al. | |
| 4,302,721 A | 11/1981 | Urbanek et al. | |

(Continued)

FOREIGN PATENT DOCUMENTS

EP      0 397 924 A1    11/1990

(Continued)

OTHER PUBLICATIONS

Ostanin, Yu. Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.

(Continued)

*Primary Examiner*—Albert W. Paladini
*Assistant Examiner*—Sean Shechtman
(74) *Attorney, Agent, or Firm*—Patterson & Sheridan, LLP

(57) ABSTRACT

Methods, systems, and mediums of controlling a semiconductor manufacturing process are described. The method comprises the steps of measuring at least one critical dimension of at least one device being fabricated on at least one of the plurality of wafers, determining at least one process parameter value on the at least one measured dimension, and controlling at least one semiconductor manufacturing tool to process the at least one of the plurality of wafers based on the at least one parameter value. A variation in the at least one critical dimension causes undesirable variations in performance of the at least one device, and at least one process condition is directed to controlling the processing performed on the plurality of wafers. The at least one manufacturing tool includes at least one of an implanter tool and an annealing tool.

44 Claims, 16 Drawing Sheets

U.S. PATENT DOCUMENTS

| | | |
|---|---|---|
| 4,368,510 A | 1/1983 | Anderson |
| 4,447,731 A | 5/1984 | Kuni et al. |
| 4,609,870 A | 9/1986 | Lale et al. |
| 4,616,308 A | 10/1986 | Morshedi et al. |
| 4,663,703 A | 5/1987 | Axelby et al. |
| 4,698,766 A | 10/1987 | Entwistle et al. |
| 4,750,141 A | 6/1988 | Judell et al. |
| 4,755,753 A | 7/1988 | Chern |
| 4,757,259 A | 7/1988 | Charpentier |
| 4,767,496 A | 8/1988 | Hieber |
| 4,796,194 A | 1/1989 | Atherton |
| 4,901,218 A | 2/1990 | Cornwell |
| 4,911,103 A | 3/1990 | Davis et al. |
| 4,938,600 A | 7/1990 | Into |
| 4,957,605 A | 9/1990 | Hurwitt et al. |
| 4,967,381 A | 10/1990 | Lane et al. |
| 5,089,970 A | 2/1992 | Lee et al. |
| 5,108,570 A | 4/1992 | Wang |
| 5,109,430 A | 4/1992 | Nishihara et al. |
| 5,171,393 A | 12/1992 | Moffat |
| 5,208,765 A | 5/1993 | Turnbull |
| 5,220,517 A | 6/1993 | Sierk et al. |
| 5,226,118 A | 7/1993 | Baker et al. |
| 5,231,585 A | 7/1993 | Kobayashi et al. |
| 5,236,868 A | 8/1993 | Nulman |
| 5,240,552 A | 8/1993 | Yu et al. |
| 5,260,868 A | 11/1993 | Gupta et al. |
| 5,270,222 A | 12/1993 | Moslehi |
| 5,283,141 A | 2/1994 | Yoon et al. |
| 5,295,242 A | 3/1994 | Mashruwala et al. |
| 5,309,221 A | 5/1994 | Fischer et al. |
| 5,329,463 A | 7/1994 | Sierk et al. |
| 5,338,630 A | 8/1994 | Yoon et al. |
| 5,347,446 A | 9/1994 | Iino et al. |
| 5,367,624 A | 11/1994 | Cooper |
| 5,369,544 A | 11/1994 | Mastrangelo |
| 5,375,064 A | 12/1994 | Bollinger |
| 5,398,336 A | 3/1995 | Tantry et al. |
| 5,402,367 A | 3/1995 | Sullivan et al. |
| 5,408,405 A | 4/1995 | Mozumder et al. |
| 5,410,473 A | 4/1995 | Kaneko et al. |
| 5,420,796 A | 5/1995 | Weling et al. |
| 5,427,878 A | 6/1995 | Corliss |
| 5,444,837 A | 8/1995 | Bomans et al. |
| 5,452,521 A | 9/1995 | Niewmierzycki |
| 5,469,361 A | 11/1995 | Moyne |
| 5,485,082 A | 1/1996 | Wisspeintner et al. |
| 5,490,097 A | 2/1996 | Swenson et al. |
| 5,495,417 A | 2/1996 | Fuduka et al. |
| 5,497,316 A | 3/1996 | Sierk et al. |
| 5,497,381 A | 3/1996 | O'Donoghue et al. |
| 5,503,707 A | 4/1996 | Maung et al. |
| 5,508,947 A | 4/1996 | Sierk et al. |
| 5,511,005 A | 4/1996 | Abbe et al. |
| 5,519,605 A | 5/1996 | Cawlfield |
| 5,525,808 A | 6/1996 | Irie et al. |
| 5,526,293 A | 6/1996 | Mozumder et al. |
| 5,534,289 A | 7/1996 | Bilder et al. |
| 5,541,510 A | 7/1996 | Danielson |
| 5,546,312 A | 8/1996 | Mozumder et al. |
| 5,553,195 A | 9/1996 | Meijer |
| 5,586,039 A | 12/1996 | Hirsch et al. |
| 5,599,423 A | 2/1997 | Parker et al. |
| 5,602,492 A | 2/1997 | Cresswell et al. |
| 5,603,707 A | 2/1997 | Trombetta et al. |
| 5,617,023 A | 4/1997 | Skalski |
| 5,627,083 A | 5/1997 | Tounai |
| 5,629,216 A | 5/1997 | Wijaranakula et al. |
| 5,642,296 A | 6/1997 | Saxena |
| 5,646,870 A * | 7/1997 | Krivokapic et al. ........ 364/578 |
| 5,649,169 A | 7/1997 | Berezin et al. |
| 5,653,894 A | 8/1997 | Ibbotson et al. |
| 5,654,903 A | 8/1997 | Reitman et al. |
| 5,655,951 A | 8/1997 | Meikle et al. |
| 5,657,254 A | 8/1997 | Sierk et al. |
| 5,661,669 A | 8/1997 | Mozumder et al. |
| 5,663,797 A | 9/1997 | Sandhu |
| 5,664,987 A | 9/1997 | Renteln |
| 5,665,199 A | 9/1997 | Sahota et al. |
| 5,665,214 A | 9/1997 | Iturralde |
| 5,666,297 A | 9/1997 | Britt et al. |
| 5,667,424 A | 9/1997 | Pan |
| 5,674,787 A | 10/1997 | Zhao et al. |
| 5,694,325 A | 12/1997 | Fukuda et al. |
| 5,695,810 A | 12/1997 | Dubin et al. |
| 5,698,989 A | 12/1997 | Nulman |
| 5,719,495 A | 2/1998 | Moslehi |
| 5,719,796 A | 2/1998 | Chen |
| 5,735,055 A | 4/1998 | Hochbein et al. |
| 5,740,429 A | 4/1998 | Wang et al. |
| 5,751,582 A | 5/1998 | Saxena et al. |
| 5,754,297 A | 5/1998 | Nulman |
| 5,761,064 A | 6/1998 | La et al. |
| 5,761,065 A | 6/1998 | Kittler et al. |
| 5,764,543 A | 6/1998 | Kennedy |
| 5,777,901 A | 7/1998 | Berezin et al. |
| 5,787,021 A | 7/1998 | Samaha |
| 5,787,269 A | 7/1998 | Hyodo |
| 5,798,529 A | 8/1998 | Wagner |
| 5,808,303 A | 9/1998 | Schlagheck et al. |
| 5,812,407 A | 9/1998 | Sato et al. |
| 5,823,854 A | 10/1998 | Chen |
| 5,824,599 A | 10/1998 | Schacham-Diamand et al. |
| 5,825,356 A | 10/1998 | Habib et al. |
| 5,825,913 A | 10/1998 | Rostami et al. |
| 5,828,778 A | 10/1998 | Hagi et al. |
| 5,831,851 A | 11/1998 | Eastburn et al. |
| 5,832,224 A | 11/1998 | Fehskens et al. |
| 5,838,595 A | 11/1998 | Sullivan et al. |
| 5,838,951 A | 11/1998 | Song |
| 5,844,554 A | 12/1998 | Geller et al. |
| 5,857,258 A | 1/1999 | Penzes et al. |
| 5,859,777 A | 1/1999 | Yokoyama et al. |
| 5,859,964 A | 1/1999 | Wang et al. |
| 5,859,975 A | 1/1999 | Brewer et al. |
| 5,862,054 A | 1/1999 | Li |
| 5,863,807 A | 1/1999 | Jang et al. |
| 5,867,389 A | 2/1999 | Hamada et al. |
| 5,870,306 A | 2/1999 | Harada |
| 5,871,805 A | 2/1999 | Lemelson |
| 5,883,437 A | 3/1999 | Maruyama et al. |
| 5,889,991 A | 3/1999 | Consolatti et al. |
| 5,901,313 A | 5/1999 | Wolf et al. |
| 5,903,455 A | 5/1999 | Sharpe, Jr. et al. |
| 5,910,011 A | 6/1999 | Cruse |
| 5,910,846 A | 6/1999 | Sandhu |
| 5,912,678 A | 6/1999 | Saxena et al. |
| 5,913,102 A | 6/1999 | Yang |
| 5,916,016 A | 6/1999 | Bothra |
| 5,923,553 A | 7/1999 | Yi |
| 5,926,690 A | 7/1999 | Toprac et al. |
| 5,930,138 A | 7/1999 | Lin et al. |
| 5,940,300 A | 8/1999 | Ozaki |
| 5,943,237 A | 8/1999 | Van Boxem |
| 5,943,550 A | 8/1999 | Fulford, Jr. et al. |
| 5,944,940 A | 8/1999 | Toshima |
| 5,948,203 A | 9/1999 | Wang |
| 5,960,185 A | 9/1999 | Nguyen |
| 5,960,214 A | 9/1999 | Sharpe, Jr. et al. |
| 5,961,369 A | 10/1999 | Bartels et al. |
| 5,963,329 A | 10/1999 | Conrad et al. |
| 5,963,881 A | 10/1999 | Kahn et al. |
| 5,978,751 A | 11/1999 | Pence et al. |
| 5,980,766 A | 11/1999 | Flamm et al. |

| | | | | | | |
|---|---|---|---|---|---|---|
| 5,982,920 A | 11/1999 | Tobin, Jr. et al. | | 6,235,440 B1 * | 5/2001 | Tao et al. .................... 430/30 |
| 6,001,699 A | 12/1999 | Nguyen et al. | | 6,236,903 B1 | 5/2001 | Kim et al. |
| 6,002,989 A | 12/1999 | Shiba et al. | | 6,237,050 B1 | 5/2001 | Kim et al. |
| 6,004,706 A | 12/1999 | Ausschnitt et al. | | 6,240,330 B1 * | 5/2001 | Kurtzberg et al. .......... 700/121 |
| 6,007,675 A | 12/1999 | Toshima | | 6,240,331 B1 | 5/2001 | Yun |
| 6,008,094 A * | 12/1999 | Krivokapic et al. ........ 438/286 | | 6,245,581 B1 | 6/2001 | Bonser et al. |
| 6,012,048 A | 1/2000 | Gustin et al. | | 6,246,972 B1 | 6/2001 | Klimasauskas |
| 6,017,771 A | 1/2000 | Yang et al. | | 6,248,602 B1 | 6/2001 | Bode et al. |
| 6,027,842 A | 2/2000 | Ausschnitt et al. | | 6,249,712 B1 | 6/2001 | Boiquaye |
| 6,033,814 A | 3/2000 | Burdorf et al. | | 6,252,412 B1 | 6/2001 | Talbot et al. |
| 6,036,349 A | 3/2000 | Gombar | | 6,253,366 B1 | 6/2001 | Mutschler, III |
| 6,037,664 A | 3/2000 | Zhao et al. | | 6,259,160 B1 | 7/2001 | Lopatin et al. |
| 6,041,263 A | 3/2000 | Boston et al. | | 6,263,255 B1 | 7/2001 | Tan et al. |
| 6,041,270 A * | 3/2000 | Steffan et al. .............. 700/121 | | 6,271,670 B1 | 8/2001 | Caffey |
| 6,049,220 A * | 4/2000 | Borden et al. .............. 324/765 | | 6,276,989 B1 | 8/2001 | Campbell et al. |
| 6,054,379 A | 4/2000 | Yau et al. | | 6,278,899 B1 | 8/2001 | Piche et al. |
| 6,054,710 A | 4/2000 | Bruggeman | | 6,280,289 B1 | 8/2001 | Wiswesser et al. |
| 6,059,636 A | 5/2000 | Inaba et al. | | 6,281,127 B1 | 8/2001 | Shue |
| 6,064,759 A | 5/2000 | Buckley et al. | | 6,284,622 B1 | 9/2001 | Campbell et al. |
| 6,072,313 A | 6/2000 | Li et al. | | 6,287,879 B1 | 9/2001 | Gonzales et al. |
| 6,074,443 A | 6/2000 | Venkatesh et al. | | 6,290,572 B1 | 9/2001 | Hofmann |
| 6,077,412 A | 6/2000 | Ting et al. | | 6,292,708 B1 | 9/2001 | Allen et al. |
| 6,078,845 A | 6/2000 | Friedman | | 6,298,274 B1 | 10/2001 | Inoue |
| 6,094,688 A | 7/2000 | Mellen-Garnett et al. | | 6,298,470 B1 * | 10/2001 | Breiner et al. ................. 716/4 |
| 6,096,649 A | 8/2000 | Jang | | 6,303,395 B1 | 10/2001 | Nulman |
| 6,097,887 A | 8/2000 | Hardikar et al. | | 6,304,999 B1 | 10/2001 | Toprac et al. |
| 6,100,195 A | 8/2000 | Chan et al. | | 6,307,628 B1 | 10/2001 | Lu et al. |
| 6,108,092 A | 8/2000 | Sandhu | | 6,314,379 B1 | 11/2001 | Hu et al. |
| 6,111,634 A | 8/2000 | Pecen et al. | | 6,317,643 B1 | 11/2001 | Dmochowski |
| 6,112,130 A | 8/2000 | Fukuda et al. | | 6,319,734 B1 * | 11/2001 | Matsuda ....................... 438/14 |
| 6,114,238 A | 9/2000 | Liao | | 6,320,655 B1 | 11/2001 | Matsushita et al. |
| 6,124,212 A | 9/2000 | Fan et al. | | 6,324,481 B1 | 11/2001 | Atchison et al. |
| 6,127,263 A | 10/2000 | Parikh | | 6,334,807 B1 | 1/2002 | Lebel et al. |
| 6,128,016 A | 10/2000 | Coelho et al. | | 6,336,841 B1 | 1/2002 | Chang et al. |
| 6,136,163 A | 10/2000 | Cheung et al. | | 6,339,727 B1 | 1/2002 | Ladd |
| 6,141,660 A | 10/2000 | Bach et al. | | 6,340,602 B1 * | 1/2002 | Johnson et al. ................. 438/7 |
| 6,143,081 A | 11/2000 | Shinriki et al. | | 6,345,288 B1 | 2/2002 | Reed et al. |
| 6,143,646 A | 11/2000 | Wetzel | | 6,345,315 B1 | 2/2002 | Mishra |
| 6,148,099 A | 11/2000 | Lee et al. | | 6,346,426 B1 * | 2/2002 | Toprac et al. ................... 438/8 |
| 6,148,239 A | 11/2000 | Funk et al. | | 6,355,559 B1 | 3/2002 | Havemann et al. |
| 6,148,246 A | 11/2000 | Kawazome | | 6,360,133 B1 | 3/2002 | Campbell et al. |
| 6,150,270 A | 11/2000 | Matsuda et al. | | 6,360,184 B1 | 3/2002 | Jacquez |
| 6,157,864 A | 12/2000 | Schwenke et al. | | 6,363,294 B1 | 3/2002 | Coronel et al. |
| 6,159,075 A | 12/2000 | Zhang | | 6,366,934 B1 | 4/2002 | Cheng et al. |
| 6,159,644 A | 12/2000 | Satoh et al. | | 6,368,879 B1 * | 4/2002 | Toprac .......................... 438/5 |
| 6,161,054 A | 12/2000 | Rosenthal et al. | | 6,368,883 B1 | 4/2002 | Bode et al. |
| 6,169,931 B1 | 1/2001 | Runnels | | 6,368,884 B1 | 4/2002 | Goodwin et al. |
| 6,172,756 B1 | 1/2001 | Chalmers et al. | | 6,368,975 B1 | 4/2002 | Balasubramhanya et al. |
| 6,173,240 B1 | 1/2001 | Sepulveda et al. | | 6,379,980 B1 | 4/2002 | Toprac |
| 6,175,417 B1 | 1/2001 | Do et al. | | 6,388,253 B1 | 5/2002 | Su |
| 6,175,777 B1 | 1/2001 | Kim | | 6,389,491 B1 | 5/2002 | Jacobson et al. |
| 6,178,239 B1 | 1/2001 | Kishinsky et al. | | 6,391,780 B1 | 5/2002 | Shih et al. |
| 6,178,390 B1 | 1/2001 | Jun | | 6,395,152 B1 | 5/2002 | Wang |
| 6,181,013 B1 | 1/2001 | Liu et al. | | 6,397,114 B1 | 5/2002 | Eryurek et al. |
| 6,183,345 B1 | 2/2001 | Kamono et al. | | 6,400,162 B1 | 6/2002 | Mallory et al. |
| 6,185,324 B1 | 2/2001 | Ishihara et al. | | 6,405,096 B1 | 6/2002 | Toprac et al. |
| 6,191,864 B1 | 2/2001 | Sandhu | | 6,405,144 B1 | 6/2002 | Toprac et al. |
| 6,192,291 B1 | 2/2001 | Kwon | | 6,413,867 B1 | 7/2002 | Sarfaty et al. |
| 6,197,604 B1 | 3/2001 | Miller et al. | | 6,417,014 B1 | 7/2002 | Lam et al. |
| 6,200,840 B1 * | 3/2001 | Chen et al. .................. 438/184 | | 6,424,417 B1 | 7/2002 | Cohen et al. |
| 6,204,165 B1 | 3/2001 | Ghoshal | | 6,427,093 B1 | 7/2002 | Toprac |
| 6,210,983 B1 | 4/2001 | Atchison et al. | | 6,432,728 B1 | 8/2002 | Tai et al. |
| 6,211,094 B1 | 4/2001 | Jun et al. | | 6,435,952 B1 | 8/2002 | Boyd et al. |
| 6,212,961 B1 | 4/2001 | Dvir | | 6,438,438 B1 | 8/2002 | Takagi et al. |
| 6,214,734 B1 | 4/2001 | Bothra et al. | | 6,440,295 B1 | 8/2002 | Wang |
| 6,217,412 B1 | 4/2001 | Campbell et al. | | 6,442,496 B1 | 8/2002 | Pasadyn et al. |
| 6,219,711 B1 | 4/2001 | Chari | | 6,449,524 B1 | 9/2002 | Miller et al. |
| 6,222,936 B1 | 4/2001 | Phan et al. | | 6,454,417 B1 | 9/2002 | Takamoto et al. |
| 6,225,639 B1 | 5/2001 | Adams et al. | | 6,455,415 B1 | 9/2002 | Lopatin et al. |
| 6,226,563 B1 | 5/2001 | Lim | | 6,455,437 B1 | 9/2002 | Davidow et al. |
| 6,226,792 B1 | 5/2001 | Goiffon et al. | | 6,455,937 B1 | 9/2002 | Cunningham |
| 6,228,280 B1 | 5/2001 | Li et al. | | 6,470,230 B1 * | 10/2002 | Toprac et al. ............... 700/121 |
| 6,230,069 B1 | 5/2001 | Campbell et al. | | 6,479,309 B1 | 11/2002 | Wright |

| | | |
|---|---|---|
| 6,479,902 B1 | 11/2002 | Lopatin et al. |
| 6,479,990 B2 | 11/2002 | Mednikov et al. |
| 6,482,660 B2 * | 11/2002 | Conchieri et al. ............. 438/7 |
| 6,484,064 B1 | 11/2002 | Campbell |
| 6,486,492 B1 | 11/2002 | Su |
| 6,492,281 B1 | 12/2002 | Song et al. |
| 6,495,452 B1 | 12/2002 | Shih |
| 6,501,555 B1 | 12/2002 | Ghandchari et al. |
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 | 2/2003 | Tobin et al. |
| 6,528,409 B1 | 3/2003 | Lopatin et al. |
| 6,537,912 B1 | 3/2003 | Agarwal |
| 6,540,591 B1 | 4/2003 | Pasadyn et al. |
| 6,560,504 B1 | 5/2003 | Goodwin et al. |
| 6,563,308 B2 | 5/2003 | Nagano et al. |
| 6,567,717 B2 * | 5/2003 | Krivokapic et al. ........ 700/121 |
| 6,580,958 B1 | 6/2003 | Takano |
| 6,587,744 B1 | 7/2003 | Stoddard et al. |
| 6,590,179 B2 | 7/2003 | Tanaka et al. |
| 6,604,012 B1 | 8/2003 | Cho et al. |
| 6,605,549 B2 | 8/2003 | Leu et al. |
| 6,606,738 B1 | 8/2003 | Bell et al. |
| 6,607,976 B2 | 8/2003 | Chen et al. |
| 6,609,946 B1 | 8/2003 | Tran |
| 6,616,513 B1 | 9/2003 | Osterheld |
| 6,618,692 B2 | 9/2003 | Takahashi et al. |
| 6,624,075 B1 | 9/2003 | Lopatin et al. |
| 6,625,497 B2 | 9/2003 | Fairbairn et al. |
| 6,630,741 B1 | 10/2003 | Lopatin et al. |
| 6,640,151 B1 | 10/2003 | Somekh et al. |
| 6,660,633 B1 | 12/2003 | Lopatin et al. |
| 6,708,074 B1 | 3/2004 | Chi et al. |
| 6,708,075 B2 | 3/2004 | Sonderman et al. |
| 6,728,587 B2 | 4/2004 | Goldman et al. |
| 6,762,130 B2 | 7/2004 | Laaksonen et al. |
| 2001/0001755 A1 | 5/2001 | Sandhu et al. |
| 2001/0003084 A1 | 6/2001 | Finarov |
| 2001/0006873 A1 | 7/2001 | Moore |
| 2001/0030366 A1 | 10/2001 | Nakano et al. |
| 2001/0039462 A1 | 11/2001 | Mendez et al. |
| 2001/0040997 A1 | 11/2001 | Tsap et al. |
| 2001/0042690 A1 | 11/2001 | Talieh |
| 2001/0044667 A1 | 11/2001 | Nakano et al. |
| 2002/0032499 A1 | 3/2002 | Wilson et al. |
| 2002/0058460 A1 | 5/2002 | Lee et al. |
| 2002/0070126 A1 | 6/2002 | Sato et al. |
| 2002/0072003 A1 | 6/2002 | Brill et al. |
| 2002/0077031 A1 | 6/2002 | Johansson et al. |
| 2002/0081951 A1 | 6/2002 | Boyd et al. |
| 2002/0089676 A1 | 7/2002 | Pecen et al. |
| 2002/0102853 A1 | 8/2002 | Li et al. |
| 2002/0107599 A1 | 8/2002 | Patel et al. |
| 2002/0107604 A1 * | 8/2002 | Riley et al. ................. 700/121 |
| 2002/0113039 A1 | 8/2002 | Mok et al. |
| 2002/0127950 A1 | 9/2002 | Hirose et al. |
| 2002/0128805 A1 | 9/2002 | Goldman et al. |
| 2002/0149359 A1 | 10/2002 | Crouzen et al. |
| 2002/0155629 A1 | 10/2002 | Fairbairn et al. |
| 2002/0160628 A1 | 10/2002 | Okoroanyanwu et al. |
| 2002/0165636 A1 | 11/2002 | Hasan |
| 2002/0171828 A1 | 11/2002 | Cohen et al. |
| 2002/0185658 A1 | 12/2002 | Inoue et al. |
| 2002/0193899 A1 | 12/2002 | Shanmugasundram et al. |
| 2002/0193902 A1 | 12/2002 | Shanmugasundram et al. |
| 2002/0197745 A1 | 12/2002 | Shanmugasundram et al. |
| 2002/0197934 A1 | 12/2002 | Paik |
| 2002/0199082 A1 | 12/2002 | Shanmugasundram et al. |
| 2003/0000922 A1 | 1/2003 | Subramanian et al. |
| 2003/0017256 A1 | 1/2003 | Shimane |
| 2003/0020909 A1 | 1/2003 | Adams et al. |
| 2003/0020928 A1 | 1/2003 | Ritzdorf et al. |
| 2003/0045098 A1 | 3/2003 | Verhaverbeke et al. |
| 2003/0092281 A1 | 5/2003 | Ramachandramurthy et al. |

FOREIGN PATENT DOCUMENTS

| | | |
|---|---|---|
| EP | 0 621 522 A2 | 10/1994 |
| EP | 0 727 715 | 8/1996 |
| EP | 0 747 795 A2 | 12/1996 |
| EP | 0 869 652 | 10/1998 |
| EP | 0 881 040 A2 | 12/1998 |
| EP | 0 895 145 A1 | 2/1999 |
| EP | 0 910 123 | 4/1999 |
| EP | 0 932 194 | 7/1999 |
| EP | 0 932 195 A1 | 7/1999 |
| EP | 1 066 925 A2 | 1/2001 |
| EP | 1 067 757 | 1/2001 |
| EP | 1 071 128 | 1/2001 |
| EP | 1 079 428 | 2/2001 |
| EP | 1 083 424 | 3/2001 |
| EP | 1 083 470 A2 | 3/2001 |
| EP | 1 092 505 A2 | 4/2001 |
| EP | 1 182 526 A2 | 2/2002 |
| GB | 2 347 885 A | 9/2000 |
| GB | 2 365 215 A | 2/2002 |
| JP | 61-66104 | 4/1986 |
| JP | 61-171147 | 8/1986 |
| JP | 61 290312 | 12/1986 |
| JP | 3-202710 | 9/1991 |
| JP | 6-184434 | 7/1994 |
| JP | 8-23166 | 1/1996 |
| JP | 8-50161 | 2/1996 |
| JP | 8-304023 | 11/1996 |
| JP | 9-246547 | 9/1997 |
| JP | 10-34522 | 2/1998 |
| JP | 10-173029 | 6/1998 |
| JP | 11-126816 | 5/1999 |
| JP | 11-135601 | 5/1999 |
| JP | 2000-183001 | 6/2000 |
| JP | 2001-76982 | 3/2001 |
| JP | 2001-284299 | 10/2001 |
| JP | 2001-305108 | 10/2001 |
| JP | 2002-9030 | 1/2002 |
| JP | 2002-343754 | 11/2002 |
| TW | 434103 | 5/2001 |
| TW | 436383 | 5/2001 |
| TW | 455938 | 9/2001 |
| TW | 455976 | 9/2001 |
| WO | WO 95/34866 | 12/1995 |
| WO | WO 98/05066 | 2/1998 |
| WO | WO 98/45090 | 10/1998 |
| WO | WO 99/09371 | 2/1999 |
| WO | WO 99/25520 | 5/1999 |
| WO | WO 99/59200 | 11/1999 |
| WO | WO 00/00874 | 1/2000 |
| WO | WO 00/05759 | 2/2000 |
| WO | WO 00/35063 | 6/2000 |
| WO | WO 00/54325 | 9/2000 |
| WO | WO 00/79355 A1 | 12/2000 |
| WO | WO 01/09934 A1 | 2/2001 |
| WO | WO 01/11679 | 2/2001 |
| WO | WO 01/15865 A1 | 3/2001 |
| WO | WO 01/18623 | 3/2001 |
| WO | WO 01/25865 | 4/2001 |
| WO | WO 01/33277 | 5/2001 |
| WO | WO 01/33501 | 5/2001 |
| WO | WO 01/52055 A3 | 7/2001 |
| WO | WO 01/52319 | 7/2001 |
| WO | WO 01/57823 A2 | 8/2001 |
| WO | WO 01/080306 | 10/2001 |
| WO | WO 01/84382 A1 | 11/2001 |
| WO | WO 02/09170 A2 | 1/2002 |
| WO | WO 02/17150 A1 | 2/2002 |
| WO | WO 02/31613 A2 | 4/2002 |

| | | | |
|---|---|---|---|
| WO | WO 02/31613 A3 | 4/2002 | |
| WO | WO 02/33737 A2 | 4/2002 | |
| WO | WO 02/37186 A1 | 5/2002 | |
| WO | WO 02/074491 | 9/2002 | |
| WO | WO 03/003447 A2 | 1/2003 | |

OTHER PUBLICATIONS

Feb. 1984. "Substrate Screening Process." *IBM Technical Disclosure Bulletin*, pp. 4824-4825.

Herrmann, D. 1988. "Temperature Errors and Ways of Elimination for Contactless Measurement of Shaft Vibrations (Abstract)." *Technisches Messen ™*, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." *IEEE Transactions on Semiconductor Manufacturing*, v. 3, n. 4, pp. 216-229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.

Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.

Burke, Peter A. Jun. 1991. "Semi-Empirical Modelling of SiO2 Chemical-Mechanical Polishing Planarization." *VMIC Conference, 1991 IEEE*, pp. 379-384. IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, n. 4, pp. 308-318.

Feb. 1993. "Electroless Plating Scheme to Hermetically Seal Copper Features." *IBM Technical Disclosure Bulletin*, pp. 405-406.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas.

Matsuyama, Akira and Jessi Niou. 1993. "A State-of-the-Art Automation System of an ASIC Wafer Fab in Japan." *IEEE/SEMI International Semiconductor Manufacturing Science Syposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Process with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Schaper, C.D., M. M. Moslehi, K.C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

Tao, K. M., R. L. Kosut, M. Ekblad, and G. Aral. Dec. 1994. "Feedforward Learning Applied to RTP of Semiconductor Wafer (Abstract)." *Proceedings of the 33rd IEEE Conference on Decision and Control*, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/Semi 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Tred Detection of Sequence-Disordered Data Using EWMA Method." *IEEE/SEMI Advanced Semiconductor Manufacturing Conference*, pp. 169-174.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6th International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/Semi Advanced Semiconductor Manufacturing Conference*, pp. 76-77.

Shindo, Wataru, Eric H. Wang, Ram Akella, and Andrzej J. Strojwas. 1997. "Excursion Detection and Source Isolation in Defect Inspection and Classification." *2nd International Workshop on Statistical Metrology*, pp. 90-93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217-224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-69.

Boning, Duane S., Jerry Stefani, and Stephanie W. Butler. Feb. 1999. "Statistical Methods for Semiconductor Manufacturing." *Encyclopedia of Electrical Engineering, J. G. Webster, Ed.*

McIntosh, John. March 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Khan, K., C. El Chemali, J. Moyne, J. Chapple-Sokol, R. Nadeau, P. Smith, C., and T. Parikh. Oct. 1999. "Yield Improvement at the Contact Process Through Run-to-Run Control (Abstract)." *24th IEEE/CPMT Electronics Manufacturing Technology Symposium*, pp. 258-263.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4.

Nov. 1999. "How to Use EWMA to Achieve SPC and EPC Control." *International Symposium on NDT Contribution to the Infrastructure Safety Systems*, Tores, Brazil. <http://www.ndt.net/abstract/ndtiss99/data/35.htm>.

Edgar, T. F., W. J. Campbell, and C. Bode. Dec. 1999. "Model-Based Control in Microelectronics Manufacturing." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232-237.

Oechsner, R., T. Tschaftary, S. Sommer, L. Pfitzner, H. Ryssel, H. Gerath, C. Baier, and M. Hafner. Sep. 2000. "Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA.

Edgar, Thomas F., Stephanie W. Butler, W. Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

ACM Research Inc. 2000. "Advanced Copper Metallization for 0.13 to 0.05 μm & Beyond." <http://acmrc.com/press/ACM-ECP-brochure.pdf>.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Chen, Argon and Ruey-Shan Guo. Feb. 2001. "Age-Based Double EWMA Controller and Its Application to CMP Processes." *IEEE Transactions on Semiconductor Manufacturing*, vol. 14, No. 1, pp. 11-19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany.

Tan, K. K., H. F. Dou, and K. Z. Tang. May-Jun. 2001. "Precision Motion Control System for Ultra-Precision Semiconductor and Electronic Components Manufacturing (Abstract)." *51st Electronic Components and Technology Conference 2001. Proceedings*, pp. 1372-1379. Orlando, Florida.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hefin Rowlands. 2001. "A Novel NN-Fuzzy-SPC Feedback Control System." *8th IEEE International Conference on Emerging Technologies and Factory Automation*, pp. 417-423.

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfaty, M., A. Shanmugasundram, A. Schwarm, J. Paik, Jimin Zhang, Rong Pan, M. J. Seamons, H. Li, R. Hung, and S. Parikh. Apr.-May 2002. "Advanced Process Control Solutions for Semiconductor Manufacturing (Abstract)." *13th IEEE/SEMI Advanced Semicondutor Manufacturing Conference. Advancing the Science and Technology of Semiconductor Manufacturing. ASMC 2002*, pp. 101-106. Boston, Ma.

Campbell, W. J., S. K. Firth, A. J. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart , Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing* , vol. 15, No. 2, pp. 214-222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

ACM Research, Inc. 2002. "ACM Ultra ECP® System: Electro-Copper Plating (ECP) Deposition." www.acmrc.com/ecp.html.

Applied Materials, Inc. 2002. "Applied Materials: Information for Everyone: Copper Electrochemical Plating." www.appliedmaterials.com/products/copper_electrochemical_plating.html.

KLA-Tencor Corporation. 2002. "KLA Tencor: Press Release: KLA-Tencor Introduces First Production-Worthy Copper CMP In-Situ Film Thickness and End-point Control System: Multi-Million Dollar Order Shipped to Major CMP Tool Manufacture." www.kla-tencor.com/news_events/press_releases/press_releases2001/984086002.html.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Cunningham, James A. 2003. "Using Electrochemistry to Improve Copper Interconnects." <http://www.e-insite.net/semiconductor/index.asp?layout=CA47465>.

Mar. 25, 2003. International Search Report for PCT/US02/24859 prepared by the European Patent Office.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*—12th Edition. Applied Materials, Inc., Santa Clara, CA.

Berman, Mike, Thomas Bibby, and Alan Smith. "Review of In Situ & In-line Detection for CMP Applications." *Semiconductor Fabtech*, 8th Edition, pp. 267-274.

"Semiconductor Manufacturing: An Overview." <http://users.ece.gatech.edu/~gmay/overview.html>.

Levine, Martin D. 1985. *Vision in Man and Machine*. New York: McGraw-Hill, Inc. pp. ix-xii, 1-58.

Pilu, Maurizio. Sep. 2001. "Undoing Page Curl Distortion Using Applicable Surfaces." *IEEE International Conference on Image Processing*. Thessalonica, Greece.

May 23, 2003. Written Opinion for PCT/US01/24910.

Williams, Randy, Dadi Gudmundsson, Kevin Monahan, Raman Nurani, Meryl Stoller and J. George Shanthikumar. Oct. 1999. "Optimized Sample Planning for Wafer Defect Inspection," *Semiconductor Manufacturing Conference Proceedings, 1999 IEEE International Symposium on Santa Clara, CA*. Piscataway, NJ. pp. 43-46.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 20, 2003. Written Opinion for PCT/US01/22833.

Miller, G. L., D. A. H. Robinson, and J. D. Wiley. Jul. 1976. "Contactless measurement of semiconductor conductivity by radio frequency-free-carrier power absorption." *Rev. Sci. Instrum.*, vol. 47, No. 7. pp. 799-805.

1999. "Contactless Bulk Resistivity/Sheet Resistance Measurement and Mapping Systems." www.Lehighton.com/Fabtech1/index.html.

2000."Microsense II Capacitance Gaging System." www.adetech.com.

El Chemali, Chadi et al. Jul./Aug. 2000. "Multizone uniformity control of a chemical mechanical polishing process utilizing a pre- and postmeasurement strategy." *J. Vac. Sci. Technol.* vol. 18, No. 4. pp. 1287-1296.

Mar. 5, 2001. "KLA-Tencor Introduces First Production-worthy Copper CMP In-situ Film Thickness and End-point Control System." http://www.kla-tencor.com/j/servlet/NewsItem?newsItemID=74.

2002. "Microsense II—5810: Non-Contact Capacitance Gaging Module." www.adetech.com.

Aug. 8, 2003. PCT International Search Report from PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

"NanoMapper wafer nanotopography measurement by ADE Phase Shift." http://www.phase-shift.com/nanomap/shtml.

"Wafer flatness measurement of advanced wafers." http://www.phase-shift.com/wafer-flatness.shtml.

"ADE Technologies, Inc.—6360." http://www.adetech.com/6360.shtml.

"3D optical profilometer MicroXAM by ADE Phase Shift." http://www.phase-shift.com/microxam.shtml.

"NanoMapper FA factory automation wafer nanotopography measurement." http://www.phase-shift.com/nanomapperfa.shtml.

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Hu, Albert, Kevin Nguyen, Steve Wong, Xiuhua Zhang, Emanuel Sachs, and Peter Renteln. 1993. "Concurrent Deployment of Run by Run Controller Using SCC Framework." IEEE/SEMI International Semiconductor Manufacturing Science Symposium. pp. 126-132.

Hu, Albert, He Du, Steve Wong, Peter Renteln, and Emanuel Sachs. 1994. "Application of Run by Run Controller to the Chemical-Mechanical Planarization Process." IEEE/CPMT International Electronics Manufacturing Technology Symposium. pp. 371-378.

Smith, Taber, Duane Boning, James Moyne, Arnon Hurwitz, and John Curry. Jun. 1996. "Compensating for CMP Pad Wear Using Run by Run Feedback Control." Proceedings of the Thirteenth International VLSI Multilevel Interconnection Conference. pp. 437-439.

Suzuki, Junichi and Yoshikazu Yamamoto. 1998. "Toward the Interoperable Software Design Models: Quartet of UML, XML, DOM and CORBA." Proceedings IEEE International Software Engineering Standards Symposium. pp. 1-10.

Klein, Bruce. Jun. 1999. "Application Development: XML Makes Object Models More Useful." Informationweek. pp. 1A-6A.

Chemali, Chadi El, James Moyne, Kareemullah Khan, Rock Nadeau, Paul Smith, John Colt, Jonathan Chapple-Sokol, and Tarun Parikh. Jul./Aug. 2000. "Multizone Uniformity Control of a Chemical Mechanical Polishing Process Utilizing a Pre- and Postmeasurement Strategy." J. Vac. Sci. Technol. A, vol. 18(4). pp. 1287-1296. American Vacuum Society.

Jensen, Alan, Peter Renteln, Stephen Jew, Chris Raeder, and Patrick Cheung. Jun. 2001. "Empirical-Based Modeling for Control of CMP Removal Uniformity." Solid State Technology, vol. 44, No. 6, pp. 101-102, 104, 106. Cowan Publ. Corp.: Washington, D.C.

Sarfaty, Moshe, Arulkumar Shanmugasundram, Alexander Schwarm, Joseph Paik, Jimin Zhang, Rong Pan, Martin J. Seamons, Howard Li, Raymond Hung, and Suketu Parikh. Apr./May 2002. "Advanced Process Control Solutions for Semiconductor Manufacturing." IEEE/SEMI Advanced Semiconductor Manufacturing Conference. pp. 101-106.

Oct. 4, 2002. International Search Report from PCT/US01/22833.

Oct. 23, 2002. International Search Report from PCT/US01/27406.

Nov. 7, 2002. International Search Report from PCT/US02/19061.

Nov. 11, 2002. International Search Report from PCT/US02/19117.

Nov. 12, 2002. International Search Report from PCT/US02/19063.

Feb. 1984. "Method and Apparatus of in Situ Measurement and Overlay Error Analysis for Correcting Step and Repeat Lithographic Cameras." *IBM Technical Disclosure Bulletin*, pp. 4855-4859.

Oct. 1984. "Method to Characterize the Stability of a Step and Repeat Lithographic System." *IBM Technical Disclosure Bulletin*, pp. 2857-2860.

Schmid, Hans Albrecht. 1995. "Creating the Architecture of a Manufacturing Framework by Design Patterns." Austin, Texas: OOPSLA.

Baliga, John. Jul. 1999. "Advanced Process Control: Soon to be a Must." Cahners Semiconductor International. www.semiconductor.net/semiconductor/issues/issues/1999/jul99/docs/feature1.asp.

July 5, 2001. "Motorola and Advanced Micro Devices Buy ObjectSpace Catalyst Advanced Process Control Product for Five Wafer Fabs." Semiconductor FABTECH. www.semiconductorfabtech.com/industry. news/9907/20.07.shtml.

Oct. 15, 2001. Search Report prepared by the Austrian Patent Office for Singapore Patent Application No. 200004286-1.

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: *AMD's Vision for 300mm*." AEC/APC.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conference on Munich, Germany 12-16 Sep. 1994.* New York, New York: IEEE. pp. 105-112.

Mar. 15, 2002. Office Action for U.S. Appl. No. 09/469,227, filed Dec. 22, 1999.

Mar. 29, 2002. Office Action for U.S. Appl. No. 09/363,966, filed Jul. 29, 1999.

Jun. 20, 2002. Office Action for U.S. Appl. No. 09/619,044, filed Jul. 19, 2000.

Sep. 26, 2002. Office Action for U.S. Appl. No. 09/637,620, filed Aug. 11, 2000.

Oct. 23, 2002. Office Action for U.S. Appl. No. 09/469,227, filed Dec. 22, 1999.

Dec. 17, 2002. Office Action for U.S. Appl. No. 09/363,966, filed Jul. 29, 1999.

Feb. 10, 2003. Office Action for U.S. Appl. No. 09/619,044, filed Jul. 19, 2000.

Apr. 9, 2003. Office Action For U.S. Appl. No. 09/928,474, filed Aug. 14, 2001.

May 8, 2003. Office Action for U.S. Appl. No. 09/637,620, filed Aug. 11, 2000.

Jun. 18, 2003. Office Action for U.S. Appl. No. 09/655,542, filed Sep. 6, 2000.

Aug. 8, 2003. International Search Report for PCT/US03/08513.

Sep. 15, 2003. Office Action for U.S. Appl. No. 09/928,474, filed Aug. 14, 2001.

Nov. 5, 2003. Office Action for U.S. Appl. No. 10/172,977, filed Jun. 18, 2002.

Dec. 1, 2003. Office Action for U.S. Appl. No. 10/173,108, filed Jun. 18, 2002.

Dec. 11, 2003. Office Action for U.S. Appl. No. 09/943,383, filed Aug. 31, 2001.

Dec. 16, 2003. International Search Report for PCT/US03/23964.

Jan. 20, 2004. Office Action for U.S. Appl. No. 09/927,444, filed Aug. 13, 2001.

Jan. 23, 2004, International Search report for PCT/US02/24860.

Feb. 2, 2004. Office Action for U.S. Appl. No. 09/363,966, filed Jul. 29, 1999.
Sun, S.C. 1998. "CVD and PVD Transition Metal Nitrides as Diffusion Barriers for Cu Metallization." *IEEE*. pp. 243-246.
Tagami, M., A. Furuya, T. Onodera, and Y. Hayashi. 1999. "Layered Ta-nitrides (LTN) Barrier Film by Power Swing Sputtering (PSS) Technique for MOCVD-Cu Damascene Interconnects." *IEEE*. pp. 635-638.
Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.
Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.
Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.
Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115-118.
Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.
Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.
Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.
Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.
Jul. 25, 2003. International Search Report for PCT/US02/24858.
Mar. 30, 2004. Written Opinion for PCT/US02/19062.
Apr. 9, 2004. Written Opinion for PCT/US02/19116.
Apr. 22, 2004. Office Action for U.S. Appl. No. 09/998,372, filed Nov. 30, 2001.
Apr. 28, 2004. Written Opinion for PCT/US02/19117.
Apr. 29, 2004. Written Opinion for PCT/US02/19061.
May 5, 2004. Office Action for U.S. Appl. No. 09/943,955, filed Aug. 31, 2001.
May 5, 2004. International Preliminary Examination Report for PCT/US01/27406.
May 28, 2004. Office Action for U.S. Appl. No. 09/943,383, filed Aug. 31, 2001.
Jun. 3, 2004. Office Action for U.S. Appl. No. 09/928,474, filed Aug. 14, 2001.
Jun. 23, 2004. Office Action for U.S. Appl. No. 10/686,589, filed Oct. 17, 2003.
Jun. 30, 2004. Office Action for U.S. Appl. No. 09/800,980, filed Mar. 8, 2001.
Jul. 12, 2004. Office Action for U.S. Appl. No. 10/173,108, filed Jun. 8, 2002.
Yang, et al., "Line-Profile and Critical Dimension Measurements Using a Normal Incidence Optical Metrology System," Proceedings of SPIE vol. 4689, Mar. 2002.
Kota, et al., "Advanced Process Control for Polysilicon Gate Etching Using Integrated Optical CD Metrology", Proceedings of SPIE, vol. 5044 (2003) pp. 90-96.
Anthony J. Toprac, "AMD's Advanced Process Control of Poly-gate Critical Dimension", SPIE Conference on Process, Equipment and Materials Control in Integrated Circuit Manufacturing, Sep. 1999, Santa Clara, CA. SPIE, vol. 3882.
Lee, M. E., "Analysis of Reflectometry and Ellipsometry Data from Patterned Structures", Characterization and Metrology for ULSI Technology: 1998 International Conference, ed. D.G. Seiler, et al., 1998, pp. 331-335.
McIntosh, J.M., et al., "Approach to CD SEM Metrology Utilizing the Full Waveform Signal", Proceedings of the SPIE, vol. 3332, pp. 51-60, Feb. 23, 1998.
Ausschnit, Christopher P., et al., "Seeing the Forest for the Trees: A New Approach to CD Control," Ed. Bhanwar Singh, Proceedings of the SPIE, vol. 3332, pp. 212-220, Feb. 23-25, 1998.
Moharam, M.G., et al., "Stable Implementation of the Rigorous Coupled-Wave Analysis for Surface-Relief Gratings: Enhanced Transmittance Matrix Approach," Journal of the Optical Society of America, vol. 12, no. 5, pp. 1077-1086, May 1995.
Chateau, Nicolas, "Algorithm for the Rigorous Coupled-Wave Analysis of Grating Diffusion," Journal of the Optical Society of America, vol. 11, no. 4, pp. 1321-1331, Apr. 1994.
G.P. Kota, et al., "Integrated CD Metrolog for Poly Si Etching", Lam Research Corporation, Plasma Etch Users Group Meeting, Jan. 17, 2002.
Raymond, Christopher J., "Angle-Resolved Scatterometry of Semiconductor Manufacturing", Microlithography World, Winter 2000, pp. 18-23.
U.S. Appl. No. 09/363,966, filed Jul. 29, 1999, Arackaparambil et al., Computer Integrated Manufacturing Techniques.
U.S. Appl. No. 09/469,227, filed Dec. 22, 1999, Somekh et al., Multi-Tool Control System, Method and Medium.
U.S. Appl. No. 09/619,044, filed Jul. 19, 2000, Yuan, System and Method of Exporting or Importing Object Data in a Manufacturing Execution System.
U.S. Appl. No. 09/637,620, filed Aug. 11, 2000, Chi et al., Generic Interface Builder.
U.S. Appl. No. 09/656,031, filed Sep. 6, 2000, Chi et al., Dispatching Component for Associating Manufacturing Facility Service Requestors with Service Providers.
U.S. Appl. No. 09/655,542, filed Sep. 6, 2000, Yuan, System, Method and Medium for Defining Palettes to Transform an Application Program Interface for a Service.
U.S. Appl. No. 09/725,908, filed, Nov. 30, 2000, Chi et al., Dynamic Subject Information Generation in Message Services of Distributed Object Systems.
U.S. Appl. No. 09/800,980, Mar. 8, 2001, filed Hawkins et al., Dynamic and Extensible Task Guide.
U.S. Appl. No. 09/811,667 Mar. 20, 2001, Yuan et al., Fault Tolerant and Automated Computer Software Workflow.
U.S. Appl. No. 09/927,444, Aug. 13, 2001, Ward et al., Dynamic Control of Wafer Processing Paths in Semiconductor Manufacturing Processes.
U.S. Appl. No. 09/928,473, Aug. 14, 2001, Koh, Tool Services Layer for Providing Tool Service Functions in Conjunction with Tool Functions.
U.S. Appl. No. 09/928,474, filed Aug. 14, 2001, Krishnamurthy et al., Experiment Management System, Method and Medium.
U.S. Appl. No. 09/943,383, filed Aug. 31, 2001, Shanmugasundram et al., In Situ Sensor Based Control of Semiconductor Processing Procedure.
U.S. Appl. No. 09/943,955, filed Aug. 31, 2001, Shanmugasundram et al., Feedback Control of a Chemical Mechanical Polishing Device Providing Manipulation of Removal Rate Profiles.
U.S. Appl. No. 09/998,372, filed Nov. 30, 2001, Paik., Control of Chemical Mechanical Polishing Pad Conditioner Directional Velocity to Improve Pad Life.
U.S. Appl. No. 09/998,384 filed Nov. 30, 2001, Paik, Feedforward and Feedback Control for Conditioning of Chemical Mechanical Polishing Pad.
U.S. Appl. No. 10/084,092, filed Feb. 28, 2002, Arackaparambil et al., Computer Integrated Manufacturing Techniques.
US 6,150,664, 11/2000, Su (withdrawn)

* cited by examiner

| % DEVIATION | 10 NM UNDER ETCH | IMPLANT COMPENSATION | |
|---|---|---|---|
| | | 120% SDE DOSE ONLY | 120% SDE DOSE + 10% HALO TILT |
| $\Delta$Tau | 16% | 0.13% | 1.92% |
| $\Delta I_{off}$ | -28% | 48% | 9% |
| $\Delta I_{DSAT}$ | -7.45% | 5.5% | 3.5% |
| $\Delta V_T$ | | -1.92% | 1% |

FIG. 11

METHOD, SYSTEM AND MEDIUM FOR CONTROLLING SEMICONDUCTOR WAFER PROCESSES USING CRITICAL DIMENSION MEASUREMENTS

FIELD OF THE INVENTION

The present invention relates to methods, systems and mediums for controlling processes for manufacturing microelectronic devices based on, in part, one or more measurements made on one or more critical dimensions such as gate lengths of devices. In particular, the measured critical dimensions can be used in determining parameter values in, for example, feed-forward and/or feed-back controlling mechanisms to reduce variations on the critical dimensions.

BACKGROUND OF THE INVENTION

FIG. 1 illustrates a conventional semiconductor process module 101 that performs one or more processes for fabricating micro-electronic devices on a batch of wafers. Such a conventional process module includes a set of processing tools (e.g., an implanter tool 1 105, an implanter tool 2 107 and an annealing tool 109) and a controller for each tool 111, 112, 113. The conventional controllers 111, 112, 113 are configured to operate/control their respective processing tools using baseline parameter values (e.g., process conditions). The baseline parameter values define, for example, implant (e.g., a doping level) and anneal (e.g., a peak temperature) conditions for the implanter tools and annealing tool, respectively. However, in the conventional process module 101, the baseline parameter values are not adjusted for processing one wafer to another wafer. In other words, the conventional controllers 111, 112, 113, once they begin to use a certain set of baseline parameter values, apply the same baseline parameter values to all wafers in a batch. The baseline parameter values cannot be adjusted even when undesirable variations are detected. These variations can be caused by a previous processing step or by any of the tool 105, 107, 109.

These undesirable variations are unacceptable due to ever increasing demands on fabricated micro-electronic devices associated with ultra large scale integration that require increased transistor and circuit speed, density and improved reliability. In particular, these demands require formation of device features with high precision and uniformity, which in turn necessitates careful process monitoring and detailed inspection of the devices while they are still being processed in the form of semiconductor wafers. Indeed, the conventional process module 101 is incapable of processing devices with such high precision and uniformity because it cannot reduce the undesirable variations. This results in a device yield rate that is less than optimal.

SUMMARY OF THE INVENTION

Embodiments of the present invention advantageously overcome the above described shortcomings of conventional processing modules. In particular, embodiments of the present invention provide systems, methods and mediums for controlling processes for fabricating micro-electronic devices using critical dimension measurements. For instance, at least some embodiments of the present invention include a method of processing a number of wafers for manufacturing semiconductor devices. The method comprises the steps of measuring at least one dimension (e.g., gate length) of at least one of the devices being fabricated on at least one of the wafers and determining control parameter values (also referred to as process conditions) based on the at least one measured dimension. (It should be noted a control parameter value and a parameter value are used interchangeably in describing embodiments of the present invention.) The method may also include the step of controlling at least one semiconductor manufacturing tool to process the at least one of the wafers based on the parameter values (e.g., in a feed-forward/feed-back manner). The at least one processing tool can include at least one implanter tool.

BRIEF DESCRIPTION OF THE DRAWINGS

The detailed description of the present application showing various distinctive features may be best understood when the detailed description is read in reference to the appended drawings in which:

FIG. 11 is a table illustrating improvements introduced by the corrections of the present invention;

DETAILED DESCRIPTION OF EMBODIMENTS OF THE PRESENT INVENTION

To alleviate the shortcomings of the conventional technology, in at least some embodiments of the present invention, the undesirable variations mentioned above can be compensated for by first measuring a critical dimension of a device being processed. A critical dimension (CD) is a dimension of a particular location of a device (e.g., a gate length). Variations in the CD may cause undesirable performance variations on the device. If such variations in a CD are detected, a subsequent processing tool(s) may be adjusted such that the undesirable variation is alleviated. This is done by generating one or more parameter values based upon the amount of the variation. The parameter values are then used by the processing tool(s) to make the appropriate adjustment.

Figure 2:
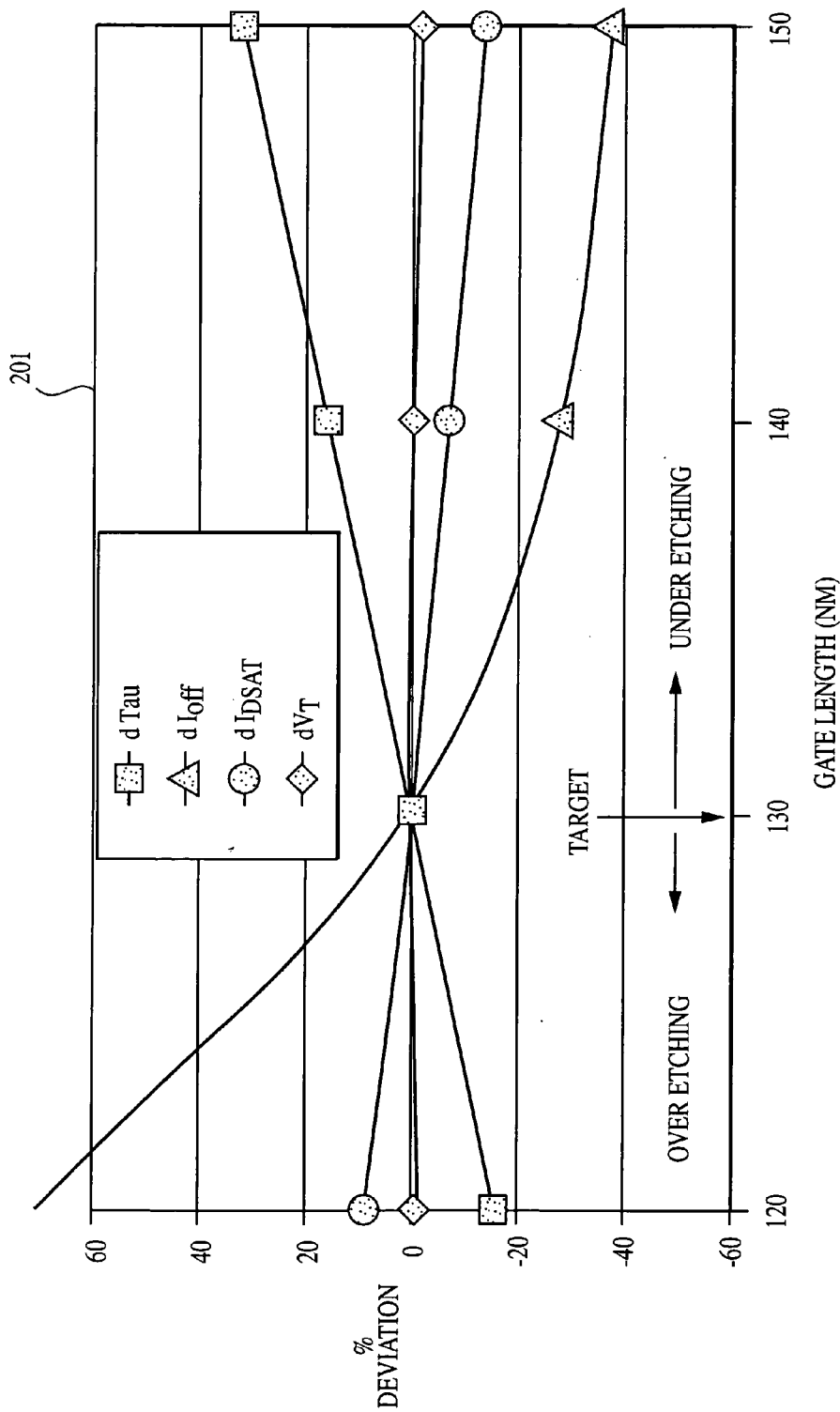
FIG. 2 is a graph illustrating relationships between variations of gate lengths of devices and percent in deviation of performance of produced devices.

Examples of performance variations are depicted in FIG. 2, which shows a graph 201 illustrating deviations in device performances caused by variations in CDs of devices. More specifically, FIG. 2 illustrates deviations in a number of parameters that measure performances of produced microelectronic devices (e.g., microprocessors) having a target for the CD as 130 nm. The parameters include: d Tau, d $I_{off}$, d $I_{DSAT}$ and d $V_T$ ("d" represents change/deviation). The value of d Tau is deviation in gate delay time, which is defined as $C*V_{dd}/I_{DSAT}$ (C: capacitance; Vdd: drain voltage; and $I_{DSAT}$ saturation current), the value of d $I_{off}$ is deviation in leakage current; the value of d $I_{DSAT}$ is deviation in saturation drive current; and the value of d $V_T$ is deviation in threshold voltage. As illustrated in FIG. 2, variations in the CD have a significant impact on device performances. A 10 nm variation (from 130 nm to 140 nm) in the CD is shown as resulting in about a 16% variation in Tau and more than a 30% variation in leakage current ($I_{off}$). Both Tau and $I_{off}$ are critical as they affect device speed and battery life, respectively.

As noted above, the conventional processing modules and their process tools are incapable of correcting undesirable variations because, in part, they are not configured to measure CDs and/or use the CD measurements generating/adjusting parameter values.

Figure 7:
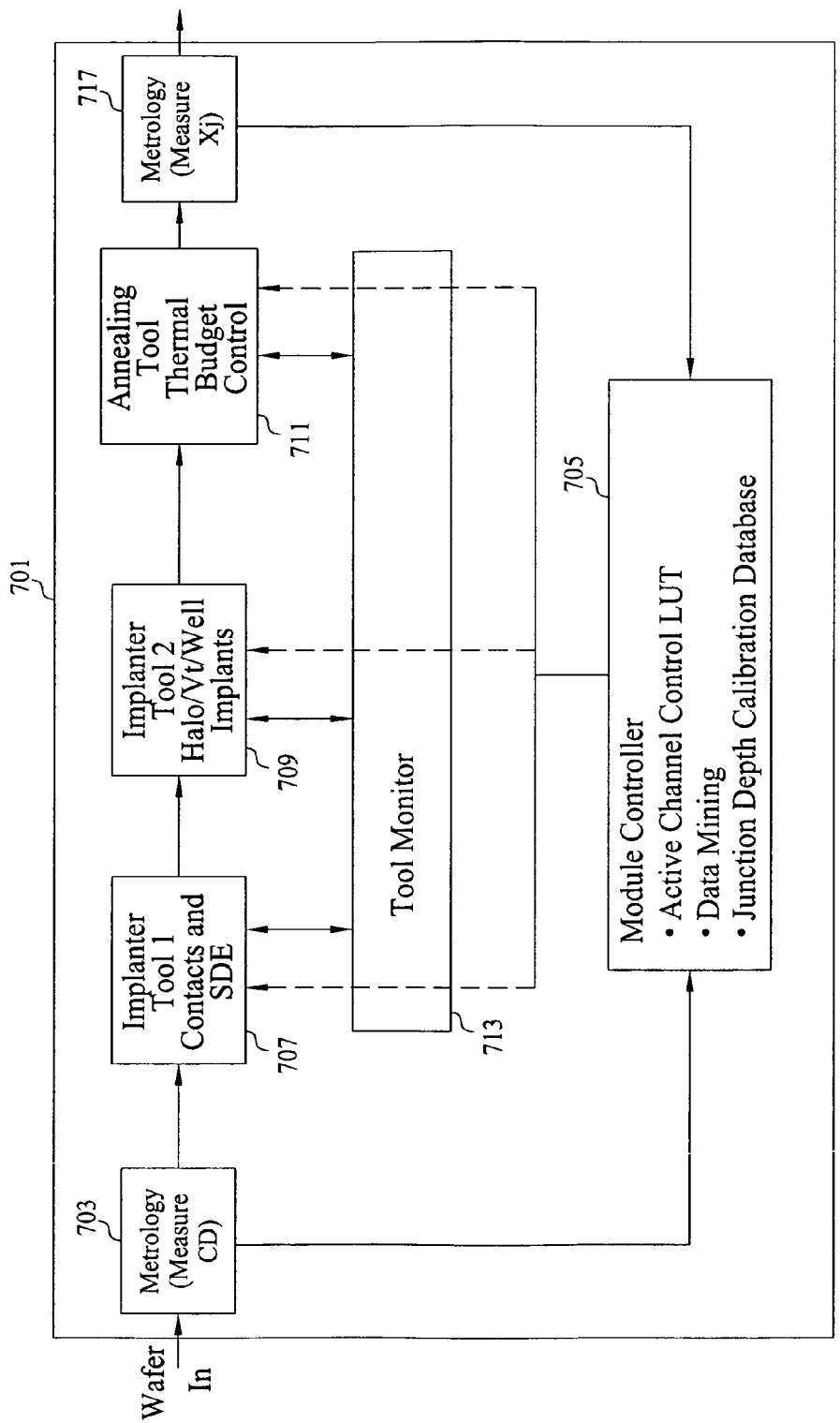
FIG. 7 is a block diagram illustrating a second example embodiment of the present invention.
Figure 9:
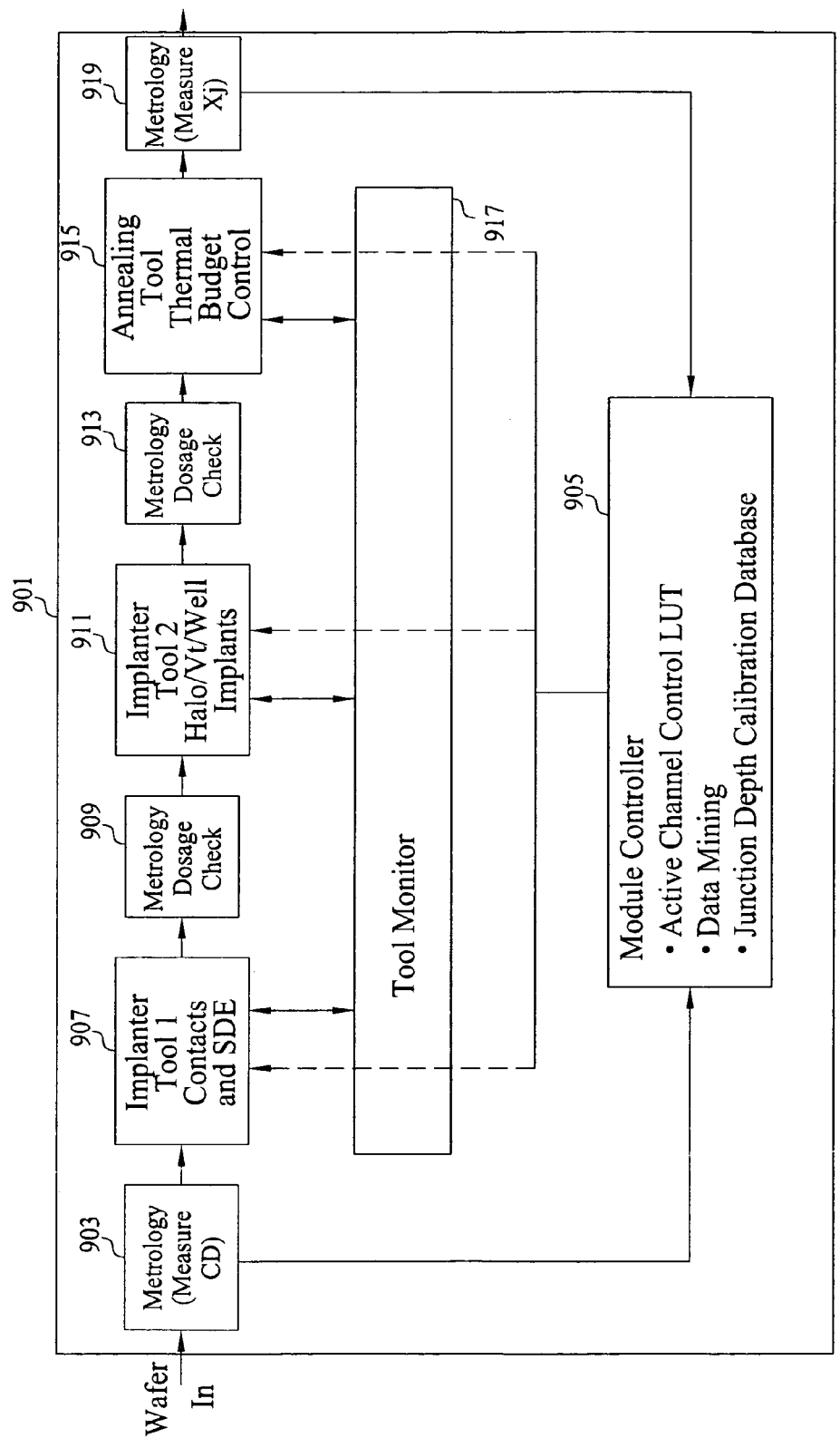
FIG. 9 is a block diagram illustrating a third example embodiment of the present invention.

At least some embodiments of the present invention are shown in FIGS. 3A–B, 7 and 9. More specifically, in FIG. 3A–B, an example module controller 305 that receives CD measurements of one or more devices on a wafer and generates parameter values based thereon is illustrated. In FIG. 7, another example module controller 705 is illustrated wherein the module controller 705 receives CD and junction depth measurements and generates parameter values based thereon. FIG. 9 illustrates yet another example module controller 905, wherein the module controller 905 includes metrology tools for checking dosages. These embodiments are provided only as examples, and various individual components, devices and/or tools of one embodiment can be omitted, added to, and/or combined with other embodiments. Detailed descriptions of these embodiments and other aspects of the present invention are provided below.

Figure 3A:
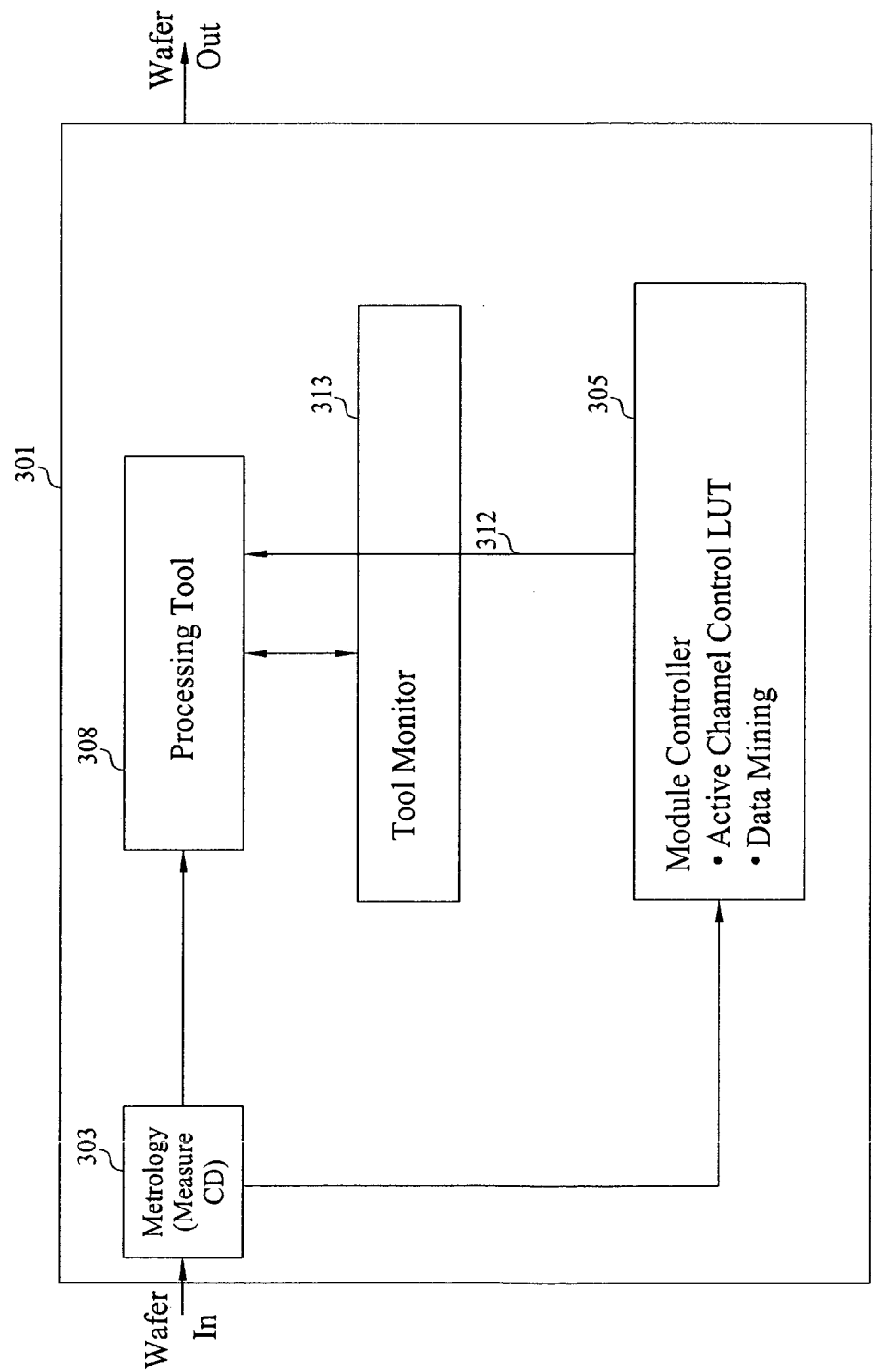
FIGS. 3A and 3B are block diagrams showing first example embodiments of the present invention.
Figure 3B:
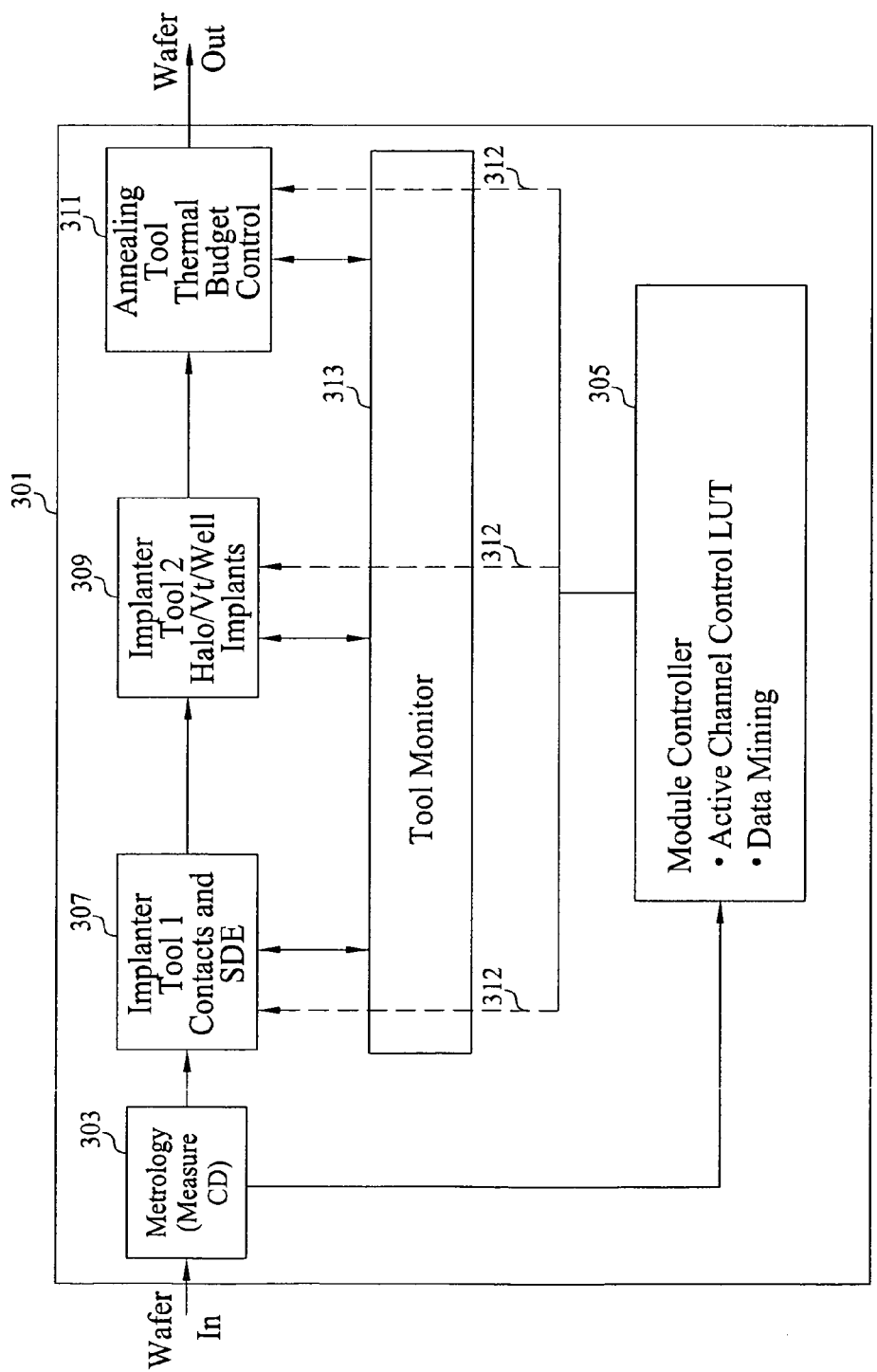

Referring to FIG. 3A, this figure illustrates an example embodiment process module 301 of the present invention in which critical dimension (CD) measurements are made and the measured CD values are used in controlling one or more processing tools by generating/adjusting parameter values. The example embodiment of FIG. 3A also includes a metrology tool 303, a module controller 305, a tool monitor 313 and a process tool 308. FIG. 3B illustrates a somewhat more specific example embodiment depicting similar concepts. More specifically, the example embodiment depicted in FIG. 3B further includes processing tools 307, 309, 311.

Now referring both to FIG. 3A and FIG. 3B, the metrology tool 303 is configured to measure CDs of one or more devices being fabricated on wafers. In at least some embodiments of the present invention, a CD is, for example, gate lengths of devices. In at least some embodiment of the present invention, CDs of devices on all dies of a wafer are measured. The average of the measured CDs is calculated and then communicated to the module controller 305. In at least some other embodiments, CD measurements are made on a sub-set of dies and their average is calculated and communicated to the module controller 305. In particular, the sub-set of dies can be a line of dies on a wafer (e.g., a horizontal line, a vertical line or a line of any orientation), a portion of dies on a wafer (e.g., an upper half or an upper left quadrant), any random combination of dies or any one die. Furthermore, it should be understood that gate length is a CD often mentioned herein only by way of example, and that embodiments of the present invention contemplate that a CD can also be any facet or dimension on a device that may cause performance variations in produced devices when it varies from a target by a certain amount.

The set of process tools in FIG. 3B, for example, can include one or any combination of processing tools such as an implanter tool 1 307, an implanter tool 2 309 and an annealing tool 311. It should also be noted that the tool 308 of FIG. 3A can be any one of an implanter tool or an annealing tool. In other words, the number of processing tools and their types are not limited to only having, for example, two implanter tools and one annealing tool as shown in FIG. 3B. It should also be noted that the various combinations of implanter and annealing tools do not necessarily represent all the tools that may be required to process a wafer. Other tools that can be included are, for example, photolithography tools, etchers, cleaners, etc. The implanter and annealing tools are illustrated as example tools that can be controlled by the module controller 305. The process tools, regardless which one of the above-described embodiments is used, are configured to provide various implant process(es), anneal process(es) and/or other process(es) by the module controller 305 and tool monitor 313. In addition, at least some embodiments of the present invention contemplate that the tool monitor 313 would be unnecessary, and that, e.g., at least some of the functions provided by the tool monitor 313 can be controlled by the module controller 305 and/or a processing tool, itself.

Embodiments of the present invention can be configured to include any type of implanter tools and annealing tools that can be controlled by using, in part, parameters and specific values thereof. For example, embodiments of the present invention can include any implant and annealing tools such as single wafer and batch tools that include: low energy, high current, medium current, high energy implanters, batch furnace, single RTP annealers, beamline and/or plasma based doping tools.

In the example embodiment shown in FIG. 3B, the implanter tool 1 307 is configured to perform source drain contracts and SDE implants. The implanter tool 2 309 is configured to perform halo/$V_T$/Well implants. The implanter tools 1 and 2 can be Quantum™ and Swift™, respectively, both of which are manufactured by Applied Materials, Inc. of Santa Clara, Calif. An example the annealing tool 311 is Radiance™, manufactured by Applied Materials, Inc. of Santa Clara, Calif. These process tools are provided herein only as examples. Other types of implanter and annealing tools that can thus also be used in embodiments of the present invention. It should be noted that, in addition to the module controller 305, each processing tool may be coupled to a tool controller 502 (shown in FIG. 5) configured to control its respective process control and set-up based on information (e.g., process conditions) received from the module controller 305.

As noted above regarding FIG. 3B, the process tools (e.g., the implanter tools 1 and 2 and the annealing tool) and their tool controllers are coupled to the module controller 305. In this example embodiment, the module controller 305 is configured to operate/control the implanter tools 1 and 2 and the annealing tool 311 using parameter values. In particular, based on CD measurements, the module controller 305 determines appropriate values for parameter values.

Examples of parameters (for which values can be obtained) include a halo angle, a dose and energy level, a Source-Drain-Extension (SDE) dose level, an energy and tilt level, a pocket implant dose level, a channel and channel $V_T$ adjust implant dose level, an energy and tilt level, a Rapid Thermal Processing (RTP) peak temperature level, and/or anneal time length.

Figure 1:
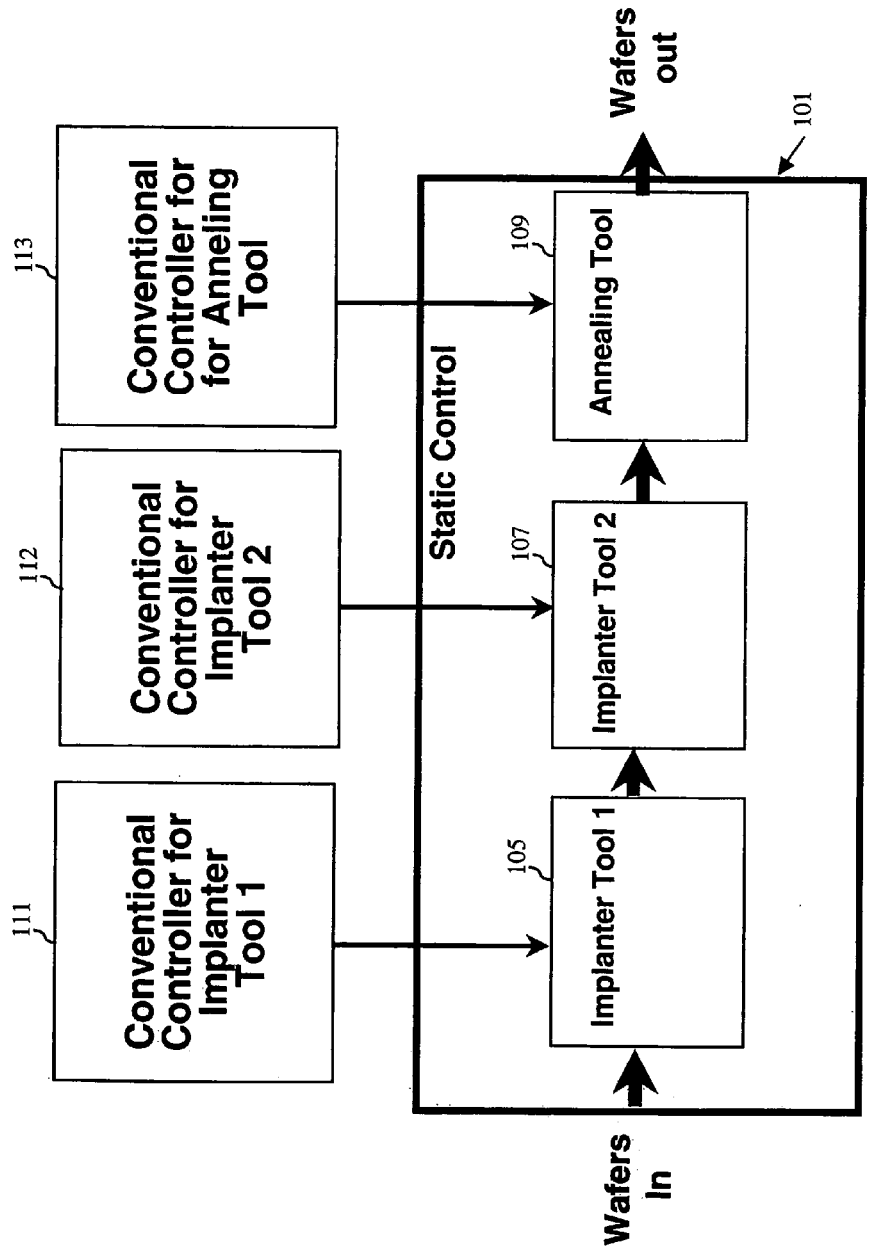
FIG. 1 is a drawing illustrating a conventional controller and processing tools.

In order to provide the context in which the parameter values may be determined, an example of CD measurements is illustrated. In this example, the critical dimension is measured by the metrology tool 303. The measured CD can be different from a target CD (thus, possibly indicating the existence of an undesirable variation). For instance, as graphically shown in FIG. 4, a device may have been erroneously processed such that a measured CD (in this example, gate length) 403 is wider than a target 401, which may have been caused by a photoresist layer 405 that has been underetched in a previous processing step. The wider gate length 403 in turn can introduce undesirable variation into other aspects of devices such as effective channel length (e.g., it may cause a wider effective channel length 412). For example, had the gate length met the target gate length 401, the effective channel length would have met a target effective channel length 411. However, due to the wider gate length 403, the measured effective channel length is wider than the target effective channel length. When only baseline parameter values are used as in the conventional process module in FIG. 1, this undesirable variation cannot be compensated for. However, embodiments of the present invention can compensate for this undesirable variation by determining parameter values (based on the gate length) and using them to modify the operation of one or more processing tools to form final effective channel length to be substantially identical/similar to the target effective channel length.

Before explaining how the parameter values are obtained and used, the step of creating parameter values as contemplated by at least some embodiments of the present invention is first described. In at least one example embodiment, the module controller 305 includes a technique for determining parameter values based on measured CD values. The parameter values can then be stored in an active channel control lookup table (LUT). The parameter values for the LUT are created, for example, by using a computer implemented simulation package (e.g., T CAD, manufactured by Integrated System Engineering, ISE, of Switzerland). In particular, the simulation package can be configured to generate (e.g., calculate) values of parameters for a particular CD measurement. In other words, in this example embodiment, the simulation package is configured to generate values of parameters (e.g., SDE, halo and RTP process conditions) for a particular gate length measurement in order to compensate for any CD variations (e.g., an over or under etching). In this way, an array of values of SDE, halo and RTP conditions are created for a series of gate lengths at a predetermined interval (e.g., every 0.1 nm, 1 nm or multiple nms of gate lengths). The array of parameter values along with their corresponding measured CD values is then collected into the LUT, which is then used to lookup a corresponding set of parameter values for any measured gate length. An example of the LUT is shown below in Table 1.

TABLE 1

| Measured Gate length CD (nm) | SDE Implant | | | | Halo Implant | | | | | Anneal (RTP) | |
|---|---|---|---|---|---|---|---|---|---|---|---|
| | Specie type (Boron) | E (keV) | Dose (ion/cm^2) | tilt/twist | Specie type (Arsenic) | E (keV) | Dose (ion/cm^2) | tilt (degree) | twist (degree) | Peak Temp (C.) | Ramp up/cooldown rate (C/sec) |
| 70 | B | 0.4 | 1.00E+15 | 0, 0 | As | 30 | 5.00E+13 | 22 | 0 | 1050 | 250/90 |
| 75 | B | 0.45 | 7.50E+14 | 0, 0 | As | 30 | 5.00E+13 | 24 | 0 | 1050 | 250/90 |
| 80 | B | 0.45 | 1.00E+15 | 0, 0 | As | 30 | 5.00E+13 | 26 | 0 | 1050 | 250/90 |
| 85 | B | 0.5 | 7.50E+14 | 0, 0 | As | 30 | 5.00E+13 | 28 | 0 | 1050 | 250/90 |
| 90 | B | 0.5 | 1.00E+15 | 0, 0 | As | 30 | 5.00E+13 | 30 | 0 | 1050 | 250/90 |
| 95 | B | 0.5 | 1.25E+15 | 0, 0 | As | 30 | 5.00E+13 | 32 | 0 | 1050 | 250/90 |
| 100 | B | 0.55 | 1.00E+15 | 0, 0 | As | 30 | 5.00E+13 | 34 | 0 | 1050 | 250/90 |
| 105 | B | 0.55 | 1.25E+15 | 0, 0 | As | 30 | 5.00E+13 | 36 | 0 | 1050 | 250/90 |
| 110 | B | 0.6 | 1.00E+15 | 0, 0 | As | 30 | 5.00E+13 | 38 | 0 | 1050 | 250/90 |

In the above table, "E (keV)," "Dose," "tilt/twist," "peak temperature" and "up/cooldown rate" are example parameters and the entries of the table are example parameter values.

In at least some embodiments of the present invention, the LUT created using the simulation package is refined based on empirical data collected by performing experiments. In such an example embodiment, a set of test wafers is fabricated to form devices having different average gate lengths. The test wafers are then put through the processes by the implanter tools 1 and 2 and annealing tool (e.g., the tools illustrated in FIG. 3B) using the parameter values of the LUT by the module controller for that particular measured CD. When the test wafers are processed, the results are collected and compared against predicted results by the simulation package. If the test wafers are processed to produce devices with the predicted results, then no adjustment on the parameter values is made to the LUT. If not, then the LUT entry is replaced or adjusted in accordance with the data collected during the experiments. These steps of comprising/replacing the entries of the LUT can be repeated until all the entries of the LUT are checked/adjusted.

In at least some embodiments of the present invention, a number of LUTs can be created, each of which may relate to device types and/or technology nodes. Device types can be microprocessors, memory chips, programmable ROMs, etc. A technology node can be a 100 nm node, a 130 nm node, a 180 nm node, etc. In at least some embodiments of the present invention, a LUT can also be created using only experimental data without using a computer simulation package.

In at least some embodiments of the present invention, instead of a LUT, one or more equations are derived to determine the parameter values for measured CDs. In yet other embodiments of the present invention, a graphical representation may be used in determining the parameter values for measured CDs. It should be noted that the present invention can use a LUT, one or more equations, one or more graphical representations, or other mechanisms for determining parameter values.

Figure 5:
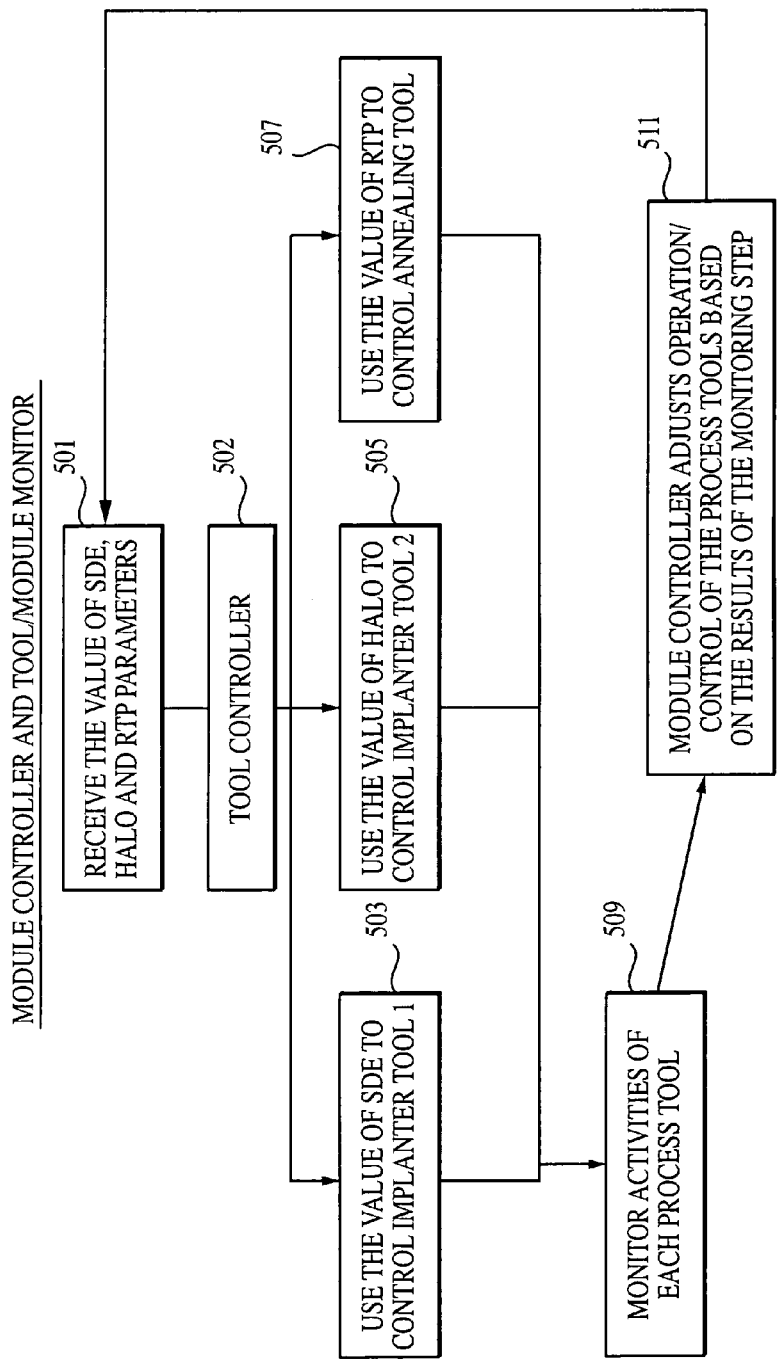
FIG. 5 is a block diagram/flowchart illustrating relationships between a module controller and a module/tool monitor as contemplated by at least some embodiments of the present invention.

Now turning to describe the module controller 305 and tool monitor 313 in more detail, FIG. 5 is a block diagram illustrating some example operations of the module controller 305 and tool monitor 313. More specifically, the module controller 305 can be configured to include an active channel control LUT. Embodiments of the present invention contemplate that the module controller 305 can also (or alternatively) use an external LUT to receive or determine parameter values (step 501). In any of these example embodiments, and in accordance with the example of Table 1 (for purposes of discussion), the module controller 305 then uses the parameter values of "SDE implant" from the LUT to control the implanter tool 1 (step 503) and uses the parameter values of "halo implant" from the LUT to control the implanter tool 2 (step 505). The module controller 305 uses the parameter values of RTP from the LUT to control the annealing tool (step 507). As indicated previously, steps such as those can be used to compensate an undesirable variance within devices on a wafer caused by some previous process step (e.g., lithography, photoresist and/or etching process steps) performed by a previous manufacturing tool. Consequently, these mechanisms of controlling the process tools based on parameter values from the LUT are referred to as feed-forward control mechanisms.

While the process tools are being operated and/or controlled by the module controller 305, at least some embodiments of the present invention contemplate that the tool monitor 313 is configured to monitor activities of each process tool (step 509). The module controller 305 can also be configured to adjust parameter values and setups of the process tools based on the results of the monitoring step 509 by the tool monitor (step 511). Examples of setups of the process tools can be one or any combination of a beam-current, a vacuum pressure, tool pressure, tool temperature, etc.

In the above-described example embodiments, the feed-forward control mechanism of the module controller 305 uses three parameter values (i.e., SDE, halo and RTP conditions) to operate/control three process tools. As noted above, the SDE parameter is used to control the implanter tool 1, the halo parameter is used to control implanter 2, and the RTP parameter is used in controlling the annealing tool. In at least some embodiments of the present invention, not all parameter values may be required. In particular, In at least one example embodiment, only the SDE parameter may be determined by using the LUT and only implanter tool 1 is controlled by the feed-forward control mechanism. In such an embodiment, other tools (i.e., the implanter tool 2 and the annealing tool), if they are present at all, would not be controlled using feed-forward parameter values, but would be controlled by, for example, the conventional control mechanism as described above in connection with FIG. 1 (i.e., using only baseline parameter values). In another example embodiment, only the halo parameter may be determined for the implanter 2, or only the RTP parameter may be determined for the annealing tool. In addition, embodiments of the present invention contemplate that any combination of two process tools can also be controlled by their respective parameter values. Accordingly, the present invention is not limited by having to use any specific number of parameter values. In FIG. 3B, lines 312 from the module controller 305 to the process tools are dotted rather than solid in order to represent that one, two or three of the process tools can be controlled by the feed-forward control mechanism. This dotted-line representation is also applicable to subsequent example embodiments depicted in FIGS. 7 and 9. It should also be understood that the specific parameters and associated values corresponding to the particular types of tools mentioned (i.e., implanter tools and annealing tools) are also by way of example, and that any number of other types of appropriate parameters and corresponding values are also contemplated by at least some embodiments of the present invention.

Figure 6:
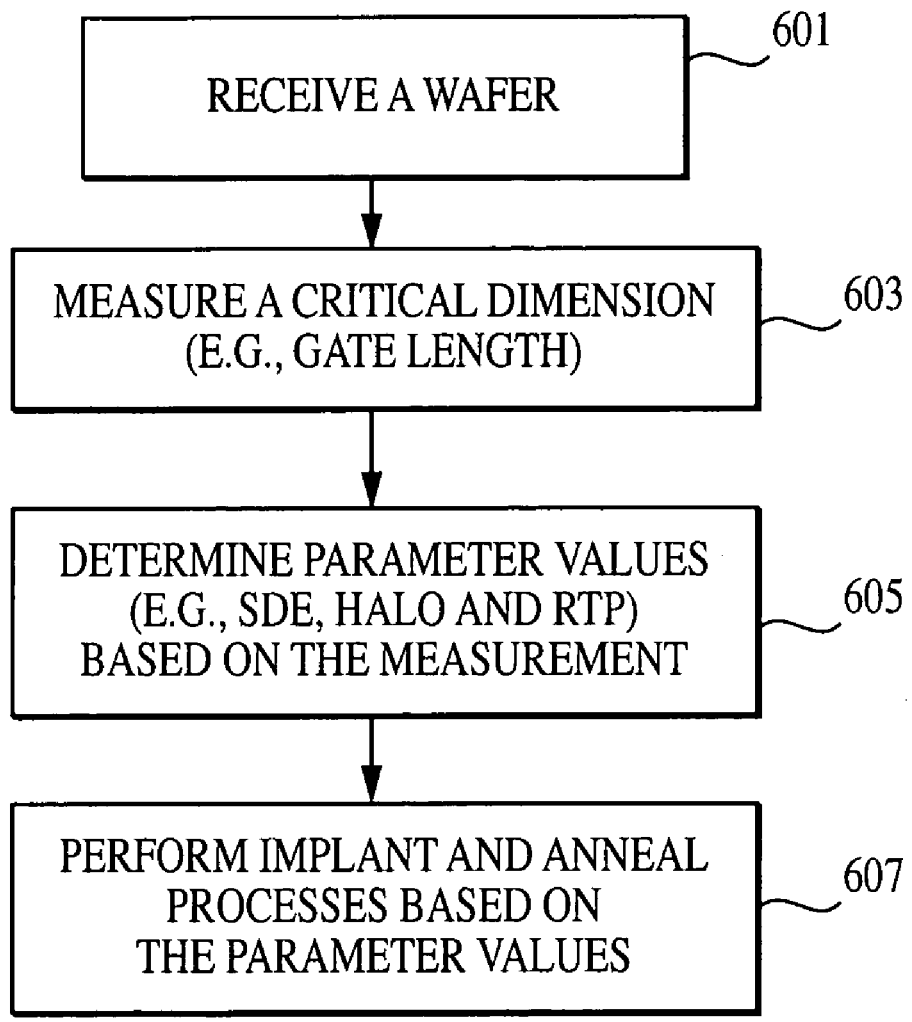
FIG. 6 is a flowchart illustrating example steps performed by the first example embodiment of the present invention.

Referring to the above-described example embodiments of FIG. 3B, using Table 1 to control each of the 3 tools mentioned therein, the module controller 305 of these embodiments are configured (in at least some embodiments of the present invention) to conduct steps shown in FIG. 6. The steps include receiving a wafer (step 601), measuring a critical dimension of one or more devices as described above (step 603), determining parameter values (step 605), and performing implant and anneal processes based on the results obtained by conducting the step of determining parameter values (step 607).

In the step of receiving a wafer (step 601), the wafer may be received from a batch of wafers, which are being fabricated to form a number of micro-electronic devices thereon.

In the step of measuring a critical dimension (CD) (step 603), a CD of a device, which can relate to a part of one or more micro-electronic devices, is measured. In at least some embodiments of the present invention, the CD can be the gate length of a selected device. In at least some other embodiments of the present invention, the CD can be an average of the gate lengths measured from many devices or test structures on the received wafer. The test structure can be a number of polysilicon lines fabricated on the wafers. The dimension of the test structure may be similar to those of devices fabricated on the wafers.

The measured CD is then received by the module controller 305, which performs the step of determining appropriate parameter values (step 605). As noted above in connection with FIG. 3, this step can be performed using a LUT, one or more equations, and/or graphical representations.

The module controller 305 then performs the step of operating/controlling the process tools (e.g., implanted tools 1 and 2 and/or the annealing tool) to process the received wafer using the determined parameter values. In other word, implant and anneal processes are performed based on the parameter values (step 607) such that undesirable variances may be compensated for. The processed wafer is then transported to a next process module (if any) to undergo further fabrication processes.

Figure 4:
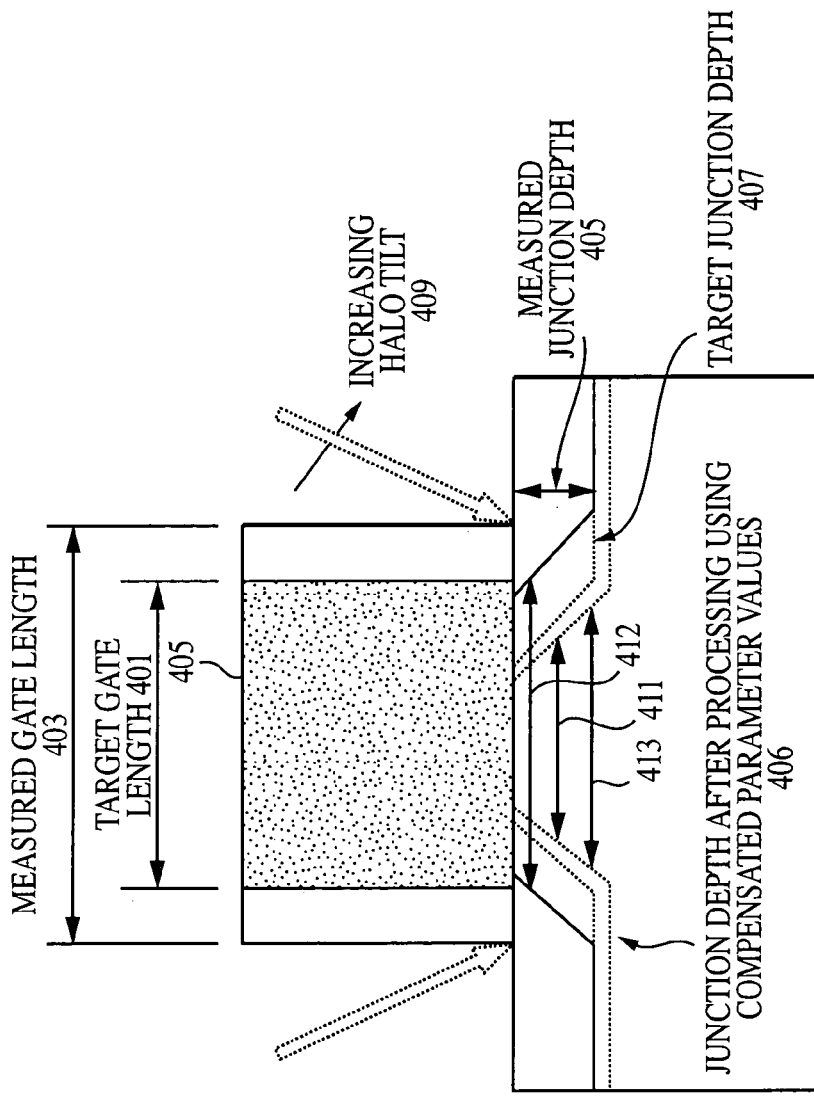
FIG. 4 is a schematic drawing illustrating an under etch condition and corrections thereof as contemplated by at least some embodiments of the present invention.

The results of such processing are graphically illustrated in FIG. 4. After processing by the process tools using the parameter (e.g., increased halo tilt 409), what might have been a wide effective channel length 412 is compensated to be closer to the target effective channel length 411.

FIG. 7 illustrates another example embodiment process module 701 of the present invention. At least some aspects of the example embodiments of FIG. 7 are similar to the example embodiments illustrated in FIG. 3 with respect to its example processing tools (e.g., implanter tools 1 707 and 2 709 and an annealing tool 711) and using a module controller 705. However, the example embodiments of FIG. 7 includes a post-process metrology tool 715 and additional control mechanisms within its module controller 713.

The post process metrology tool 717 is configured to receive a wafer that has been processed by, for example, the processing tools 707, 709, 711 and to make a Measurement After the Process (MAP), a post process measurement, on the processed wafer. In at least some embodiments of the present invention, the MAP is made on, for example, junction depth of a test structure being fabricated on the processed wafer. The MAPs can be made on one or more test structures on the processed wafer. In embodiments that the MAP is performed on more than one test structure, the average of the MAPs can be used in a feedback process which is described in detail below.

Figure 8:
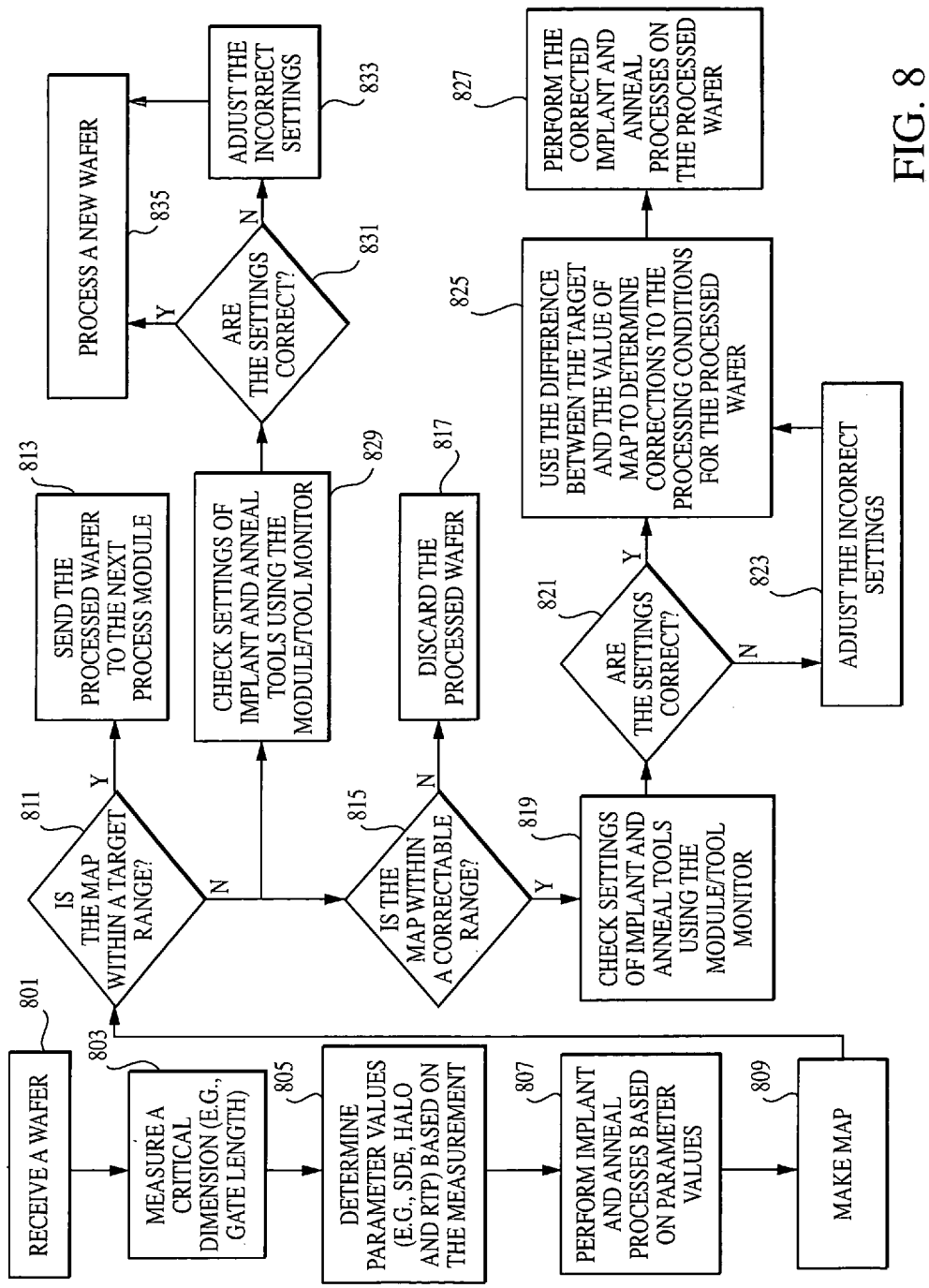
FIG. 8 is a flowchart illustrating example steps performed by the second example embodiment of the present invention.

FIG. 8 illustrates the steps performed by the example embodiments of FIG. 7 of the present invention. At least some aspects of the first four steps (e.g., the steps of receiving a wafer (step 801), measuring a CD (step 803), determining parameter values (step 805), and performing implant and anneal processes (step 807)) are similar to the corresponding steps described above in connection with FIG. 6 (steps 601, 603, 605 and 607). After these steps, in the embodiments of FIG. 7, the post-processing metrology tool 715 makes a MAP (step 809). The module controller 705 may cause one of two different sets of steps be performed after the MAP is made, depending upon: (i) whether the MAP value is within a target range (determined in step 811); (ii) whether the MAP is within a correctable range, but it is outside of the target range (determined in step 815). An example of the target range of, e.g., junction depth, is 300±6 angstroms, and an example of the correctable range is ±30% of the target range. The information relating to the target ranges and correctable ranges is stored in a junction depth calibration database in the module controller 705. It should be noted that, in at least some embodiments of the present invention, the module controller can decide to instruct the metrology tool 717 not to make the MAP when the wafer is processed properly (e.g., the parameter values stayed within an acceptable range.)

When the MAP is within the target range, the processed wafer is considered to be correctly processed within an acceptable level of variation. The processed wafer is then transported to a next process module for subsequence processes, if any (step 813).

When the MAP is outside of the target range, for processing subsequent wafers, settings of the implanter and anneal tools are checked (step 829) by the module/tool monitor 713. Examples of the settings of the tools may include one or any combination of ion energy, ion dose, ion beam current, anneal temperature and/or anneal ramp up rate. An example value may be 500 eV for the ion energy setting. The module controller 705 determines whether or not the settings are correctly set (step 831). If not, the module controller 705 either adjusts the settings (step 833) or notifies an operator to adjust the settings. After settings have been adjusted or the module controller determines that the settings were set correctly, a new wafer is received and processed (step 835).

With respect to the wafer that has been processed and its MAP has been determined as outside of the target range and outside of the correctable range, the processed wafer is considered as not usable and discarded (step 817). It should be noted that steps 829 and 815 can be performed in parallel.

When the wafer that has been processed and its MAP has been determined as outside of the target range but within the correctable range, settings of implanting and anneal tools are checked (step 819) by the module/tool monitor 713. The module controller 705 determines whether or not the settings are correctly set (step 821). If not, the module controller 705 either adjusts the settings (step 823) or notifies an operator to adjust the settings. After the settings have been adjusted or the module controller determines that the settings were set correctly, the difference between a target MAP and the measured MAP may be used in determining corrections to the processing conditions for the processed wafer (step 825). Subsequently, the implant process(es) are performed again on the processed wafer (step 827) using the correction parameter values. (For example, a anneal process(es) can also be re-performed.) In other words, the processed wafer which was incorrectly processed is reprocessed by the process module 601 using the correction parameter values. The correction parameter values can be determined using a LUT that has been created using similar steps as those used in creating the LUT for parameter values as described above in connection with Table 1.

The reprocessed wafer can then be transported to a next process module, if any, for further processing. Alternatively, the post-process metrology tool can make another MAP and perform the above-described steps again starting from step 809.

FIG. 9 shows yet another example embodiment process module 901 of the present invention. The example embodiment of FIG. 9 is, in at least some aspects, similar to the second example embodiment illustrated in FIG. 7 with respect to, e.g., its example processing tools (e.g., the implanter tools 1 907 and 2 911 and the annealing tool 913) and creating and using a module controller 905. However, in this example embodiment, metrology tools 909, 913 configured to check the dosage of each implementing step are placed between the implanter tool 1 907 and the implanter tool 2 911 and between the implanter tool 2 911 and the annealing tool 915.

In operation (and referring also to FIG. 10a), after a doping step by the implanter tool 1 907, the metrology tool 909 measures the dosage (step 1009), if the dosage is within a target range (step 1011), then the wafer is sent to the implanter tool 2 911 (step 1015). If the measured dosage is not within a target range (e.g., it is under dosed), then the wafer is sent back to the implanter tool 1 907 and reprocessed (step 1013). An example of an under dose is 70–80% of $1 \times 10^{15}$ Ions/cm$^2$.

In an alternative embodiment, a correctable range can be defined to determine if the dosage can be corrected. If the measured dosage is within correctable range, then the wafer can be sent back to the implanter tool 1 907; however, if the dosage is outside of the correctable range, then the wafer is discarded. Similar processes take place at the metrology tool 913.

It should be noted that similar modifications can be made to the example embodiment of FIGS. 3A, 3B and 7. For example, in a modified embodiment of FIG. 3B, a dosage checking metrology tool can be inserted between process tools. In at least some other embodiments of the present invention, only one metrology tool to measure the dosage can be placed between the process tools (e.g., between the implanter tool 2 and the annealing tool).

Figure 10A:
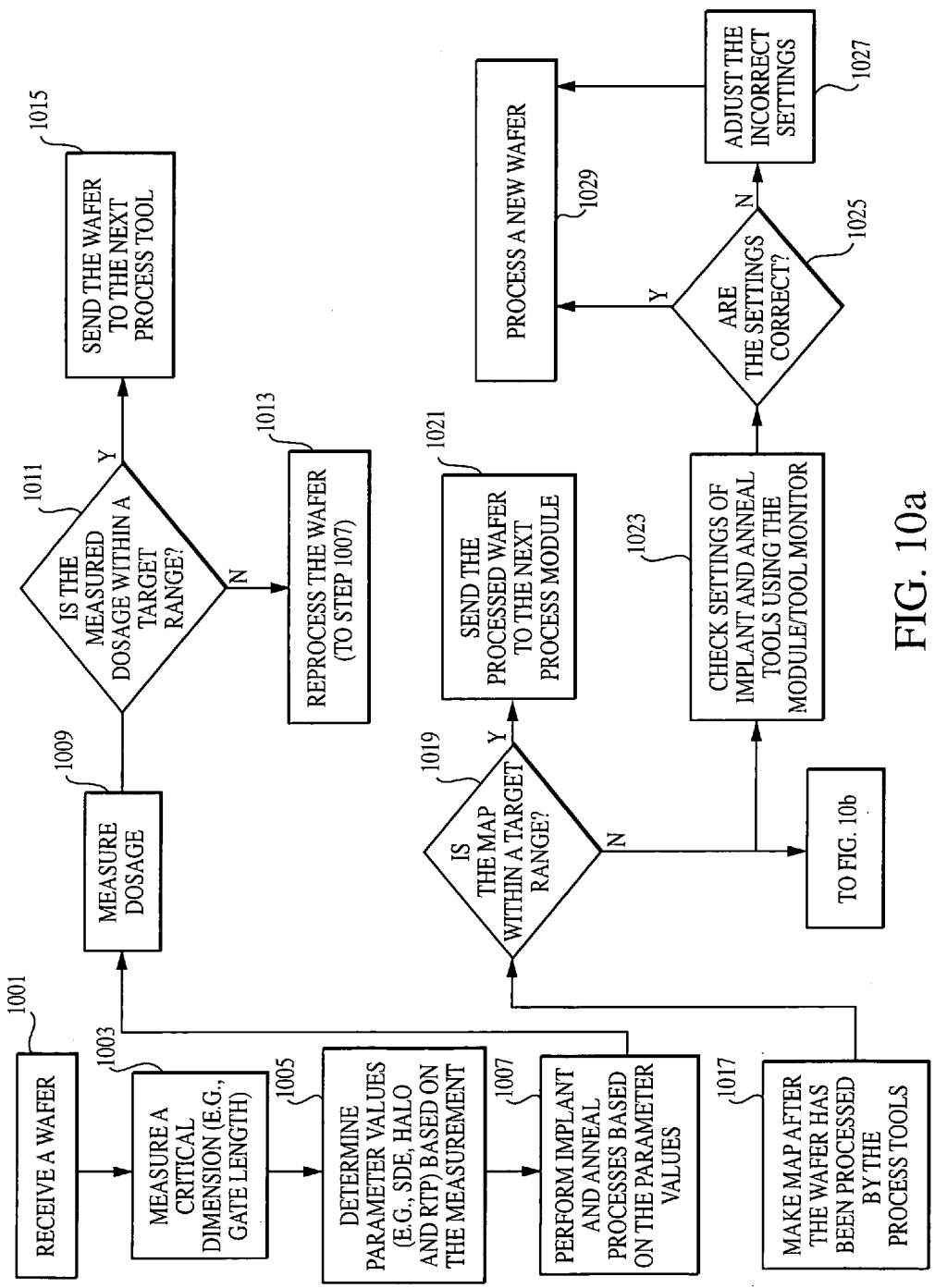
FIGS. 10a and 10b are flowcharts illustrating example steps performed by the third example embodiment of the present invention.
Figure 10B:
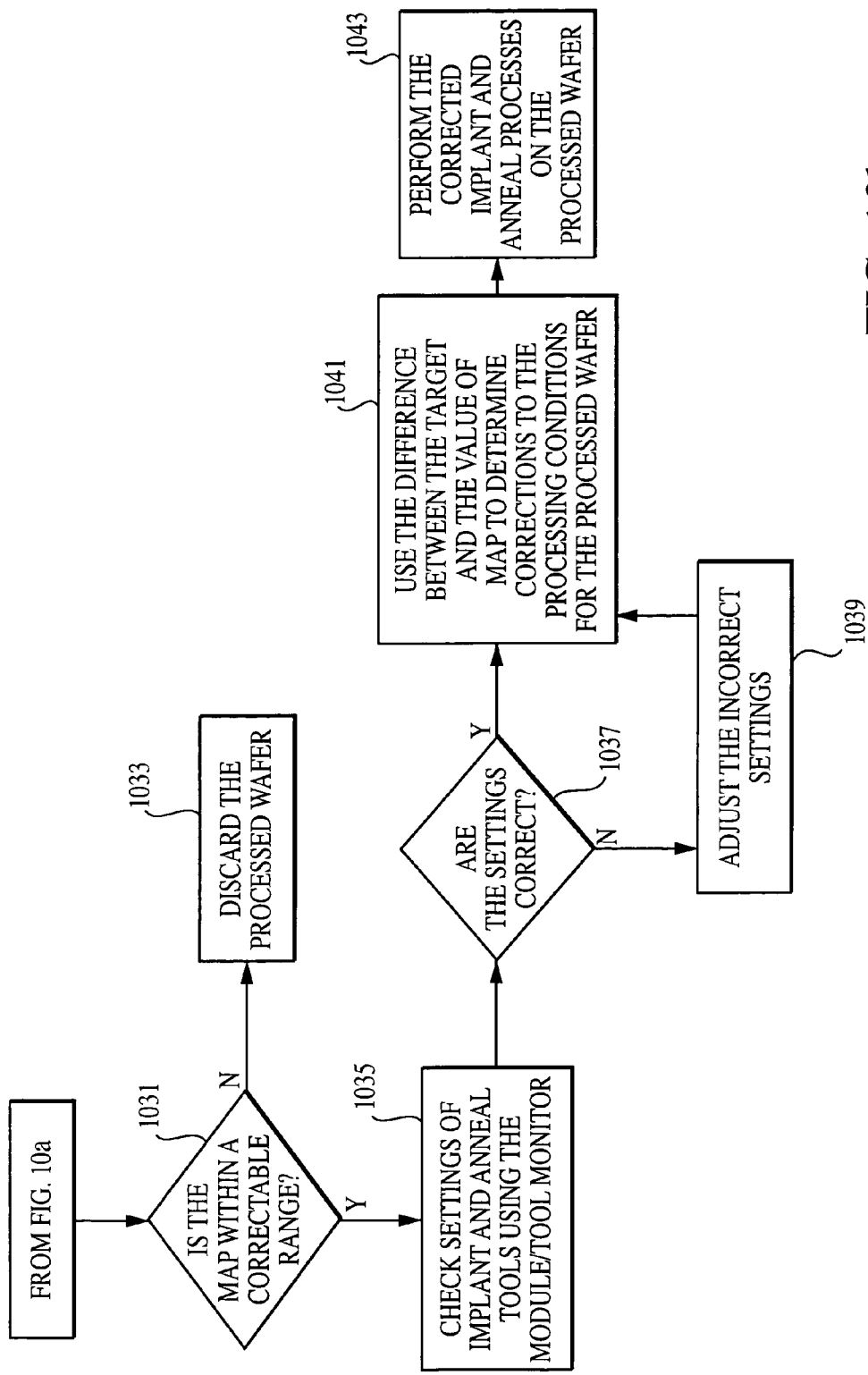

FIGS. 10a–b illustrate other steps that can be performed by at least some embodiments of the present invention. Each of the steps (steps starting from step 1017) is similar to the steps described above in connection with the example embodiment of FIG. 7 of the present invention.

In the above-described example embodiments, various components and steps have been illustrated and described. Relating to those example embodiments, FIG. 11 illustrates an example end result of using the above described steps of measuring the CD, obtaining parameter values from the LUT and using the parameter values to compensate for any undesirable variations.

The first column of a table 1101 lists the parameters relating to gate length affected by variations in a critical dimension. The second column shows percent deviation of values of those parameters when the photoresist is under etched 10 nm. When uncompensated parameter values are used, Tau deviates 16% and $I_{off}$ deviates 28% and $I_{DSAT}$ deviates 7.45%. When a parameter of the implant is compensated, e.g., 120% of a baseline SDE dosage is applied. The deviation of Tau is reduced to 0.13%. However, $I_{off}$ is increased to 48% and $I_{DSAT}$ is reduced to 5.5% and $V_T$ is at 1.92%. This effect can be further improved by applying 120% of SDE dose and additional 10% of halo tilt from their respective baseline conditions. When the compensated parameter values are used, the deviation in Tau is reduced to 1.92%, $I_{off}$ is reduced to 9%, $I_{DSAT}$ is reduced to 3.5% and $V_T$ is reduced to 1%. It should be understood that the parameter and parameter values, results, etc. are all by way of example, and that one, some or all can depend on a variety of factors (e.g., device design and geometry).

Figure 12:
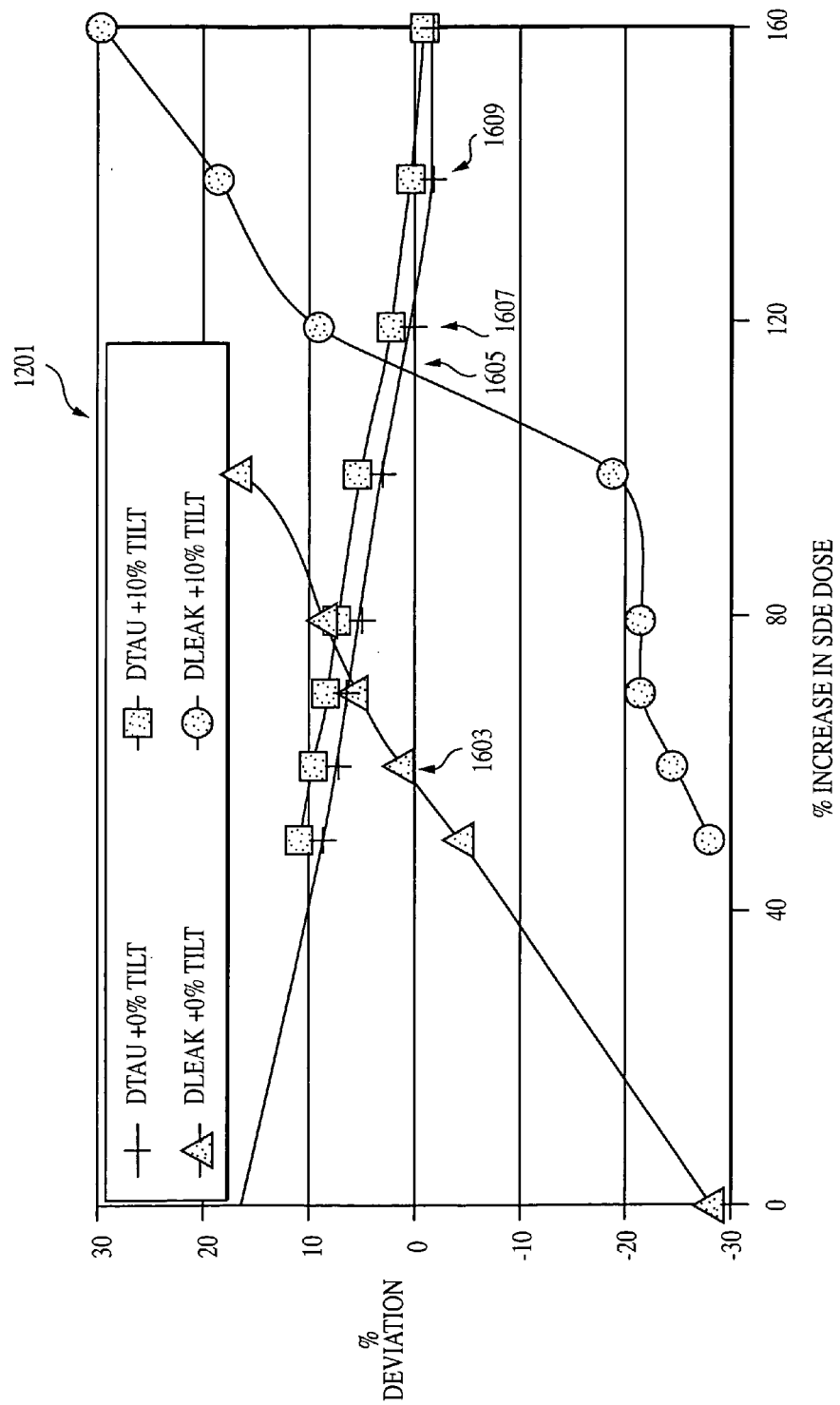
FIG. 12 is a graph illustrating changes introduced by a compensated SDE dosage.

Graphical illustrations of improvements in at least some embodiments of the present invention are provided in FIG. 12, which shows the results obtained for deviation in Tau and leakage current when SDE and halo tilt are adjusted to compensate an under etch process (e.g., 10 nm under etch). In particular, a line with cross-hair marks shows deviation in Tau when no halo tilt is provided and a line with rectangles shows deviation in Tau when 10% halo tilt is provided. Also, a line with triangles shows deviation in leakage current when no halo tilt is provided and a line with circles shows deviation in leakage current when 10% halo tilt is provided. Cross points of these lines with 0% deviation line represent partially optimal compensations.

In at least some embodiments of the present invention, for the lowest deviation in leakage current: 1) no halo tilt and approximately 60% increase in SDE dosage (point 1203); and 2) 10% halo tilt and approximately 110% increase in SDE dosage (point 1205).

For the lowest deviation in Tau: 1) no halo tilt and approximately 120% increase in SDE dosage (point 1205); and 2) 10% halo tilt and approximately 140% increase in SDE dosage (point 1207).

Based on the above observations, 10% halo tilt and approximately 120% increase in SDE dosage may yield the lowest deviations in Tau and leakage current. For example, the percent deviation is minimal when the SDE dosage is increased by about 120% and the halo tilt was increased by 10%. It should be noted that similar compensations can also be achieved by adjusting other conditions (for example, energy, tilt angle of source drain extension, energy and angle of halo implants, etc.)

An example embodiment of the computer on which any of the module controller embodiments of various other aspects of the present invention may operate is described below in connection with FIGS. 13–14.

Figure 13:
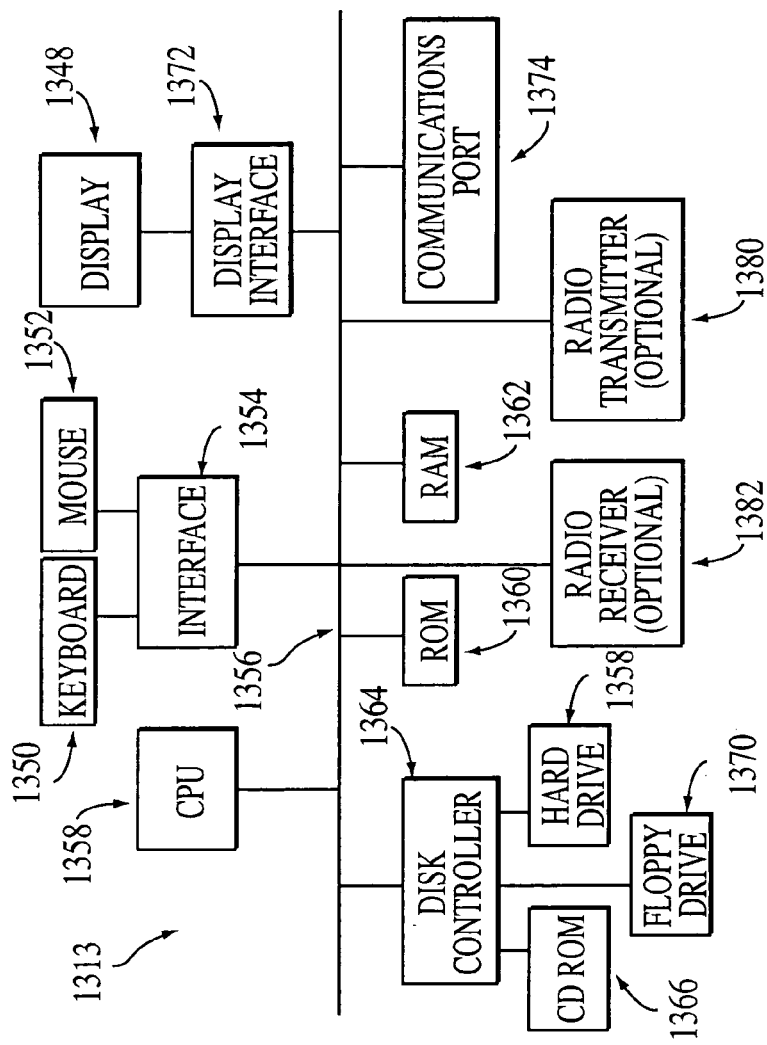
FIG. 13 is a block diagram representation of an example embodiment of a module controller.

FIG. 13 illustrates a block diagram of one example of the internal hardware of (e.g., a module controller 1313), which represents any of the above described module controllers 305, 705 or 905. A bus 1356 serves as the main information highway interconnecting various components therein. CPU 1358 is the central processing unit of the module controller 1313, performing calculations and logic operations required to execute the control/operation processes of the present invention as well as other programs. Read only memory (ROM) 1360 and random access memory (RAM) 1362 constitute the main memory of model controller 1313. Disk controller 1364 interfaces one or more disk drives to the system bus 1356. These disk drives are, for example, floppy disk drives 1370, or CD ROM or DVD (digital video disks) drives 1366, or internal or external hard drives 1368. These various disk drives and disk controllers are optional devices.

A display interface 1372 interfaces display 1348 and permits information from the bus 1356 to be displayed on display 1348. Display 1348 may be used in displaying various graphs. Communications with external devices, such as the other components of the system described above, occur utilizing, for example, communication port 1374. Optical fibers and/or electrical cables and/or conductors and/or optical communication (e.g., infrared, and the like) and/or wireless communication (e.g., radio frequency (RF), and the like) can be used as the transport medium between the external devices and communication port 1374. Peripheral interface 1354 interfaces the keyboard 1350 and mouse 1352, permitting input data to be transmitted to bus 1356. In addition to these components, the module controller 1313 also optionally includes an infrared transmitter and/or infrared receiver. Infrared transmitters are optionally utilized when the computer system is used in conjunction with one or more of the processing components/stations/modules that transmit/receive data via infrared signal transmission. Instead of utilizing an infrared transmitter or infrared receiver, the computer system may also optionally use a low power radio transmitter 1380 and/or a low power radio receiver 1382. The low power radio transmitter transmits the signal for reception by components of the production process, and receives signals from the components via the low power radio receiver. The low power radio transmitter and/or receiver are standard devices in industry.

Although the module controller in FIG. 13 is illustrated having a single processor, a single hard disk drive and a single local memory, the analyzer is optionally suitably equipped with any multitude or combination of processors or storage devices. For example, the computer may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 14:
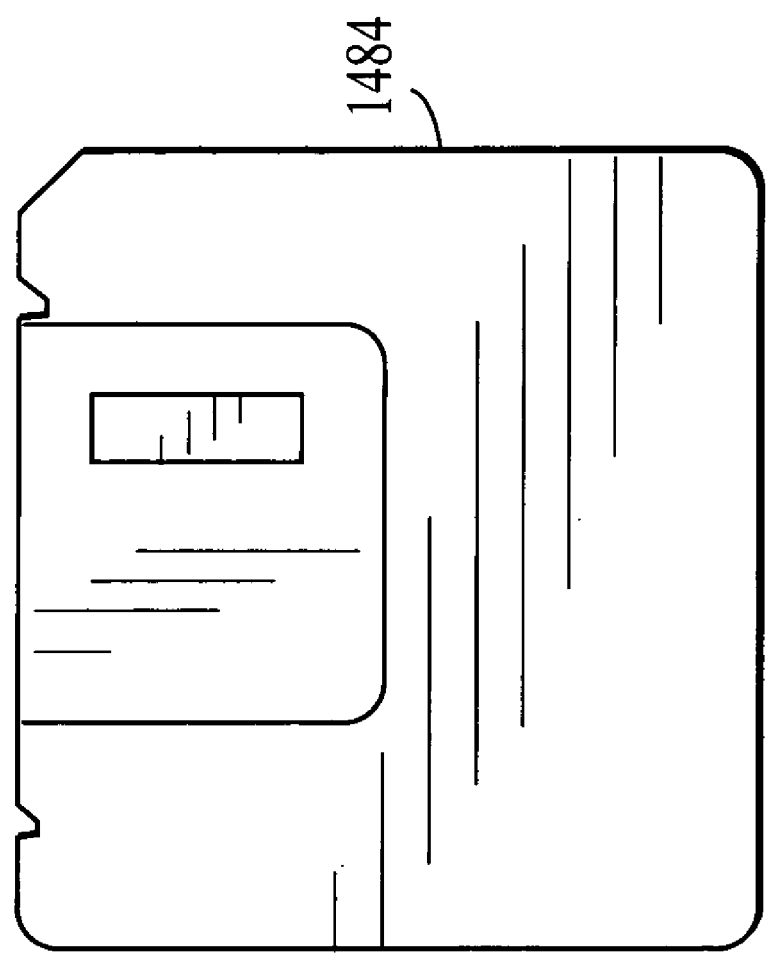
FIG. 14 illustrates one example of a memory medium which may be used for storing computer programs of the module controller of the present invention.

FIG. 14 is an illustration of an example computer readable memory medium 1484 utilizable for storing computer readable code or instructions. As one example, medium 1484 may be used with disk drives illustrated in FIG. 13. Typically, memory media such as floppy disks, or a CD ROM, or a digital video disk will contain, for example, a multi-byte locale for a single byte language and the program information for controlling the modeler to enable the computer to perform the functions described herein. Alternatively, ROM 1360 and/or RAM 1362 illustrated in FIG. 13 can also be used to store the program information that is used to instruct the central processing unit 1358 to perform the operations associated with various automated processes of the present invention. Other examples of suitable computer readable media for storing information include magnetic, electronic, or optical (including holographic) storage, some combination thereof, etc.

In general, it should be emphasized that the various components of embodiments of the present invention can be implemented in hardware, software or a combination thereof. In such embodiments, the various components and steps would be implemented in hardware and/or software to perform the functions of embodiments of the present invention. Any presently available or future developed computer software language and/or hardware components can be employed in such embodiments of the present invention. For example, at least some of the functionality mentioned above could be implemented using Visual Basic, C, C++, or any assembly language appropriate in view of the processor(s) being used. It could also be written in an interpretive environment such as Java and transported to multiple destinations to various users.

The many features and advantages of embodiments of the present invention are apparent from the detailed specification, and thus, it is intended by the appended claims to cover all such features and advantages of the invention which fall within the true spirit and scope of the invention. In addition, it should be understood that aspects of the various embodiments and alternative embodiments mentioned therein can overlap and be combined, forming additional embodiments that are also contemplated herein. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of processing a plurality of wafers for manufacturing semiconductor devices, the method sequentially comprising:
   (a) measuring at least one critical dimension of at least one device fabricated on at least one of the plurality of wafers by a metrology tool of an implant-annealing process module before the at least one of the plurality of wafers has been processed in at least one implant or annealing processing tool of the implant-annealing process module, wherein a variation in the at least one critical dimension causes a variation in performance of the at least one device;
   (b) determining at least one control parameter value of the at least one implant or annealing processing tool based on the measured at least one critical dimension, wherein the at least one control parameter value is selected from the group that consists of a halo angle, a Source Drain-Extension (SDE) dose level, an energy and tilt level, a pocket implant dose level, and a channel and channel $V_T$ adjust implant dose level;
   (c) controlling the at least one implant or annealing processing tool of the implant-annealing process module to process the at least one of the plurality of wafers based on the at least one control parameter value;
   (d) measuring at least one post process dimension of the at least one of the plurality of wafers after step (c), wherein the measured at least one post process dimension is different than the measured at least one critical dimension;
   (e) determining whether the measured at least one post process dimension is within a first predetermined range; and
   (f) adjusting the at least one implant or annealing processing tool of the implant-annealing process module upon determining that the measured at least one post process dimension is not within the first predetermined range.

2. The method of claim 1, wherein the at least one post process dimension is a junction depth and the method further comprises:
   (g) sending the at least one of the plurality of wafers to a next processing tool upon determining that the at least one post process dimension is within the first predetermined range.

3. The method of claim 1 wherein the at least one critical dimension is a gate length.

4. The method of claim 1, wherein the at least one implant or annealing processing tool includes at least one implanter tool for implanting ions into a junction of said at least one device for at least reducing deviation in gate delay.

5. The method of claim 4, wherein the at least one implanter tool is a beamline type implanting tool.

6. The method of claim 1, wherein the first predetermined range is plus or minus 10 percent from a respective target value.

7. The method of claim 1, further comprising:
   forming the at least one critical dimension prior to measuring at least one critical dimension.

8. The method of claim 4, wherein the at least one implanter tool processes one wafer at a time.

9. The method of claim 1, wherein the at least one implant or annealing processing tool includes at least one annealing tool for at least reducing deviation in gate delay.

10. The method of claim 9, wherein the annealing tool is controlled by parameters that include at least one of a Rapid Thermal Processing (RTP) peak temperature level and anneal time length.

11. An implant-annealing process module comprising:
   a first metrology tool configured to measure at least one critical dimension of at least one device fabricated on at least one of a plurality of wafers before the at least one of the plurality of wafers is processed by at least one implant or annealing processing tool of the implant-annealing process module, wherein a variation in the at least one critical dimension causes a variation in performance of the at least one device;
   a module controller configured to determine at least one control parameter value of the implant or annealing processing tool based on the measured at least one critical dimension, wherein the at least one implant or annealing processing tool of the implant-annealing process module is configured to be controlled by the module controller in processing the at least one of the plurality of wafers based on the at least one control parameter value and wherein the at least one control parameter value determined by the module controller is selected from the group that consists of a halo angle, a Source Drain-Extension (SDE) dose level, an enemy and tilt level, a pocket implant dose level, and a channel and channel $V_T$ adjust implant dose level; and
   a second metrology tool configured to measure at least one post process dimension of the at least one of the plurality of wafers, wherein the at least one post process dimension is different from the at least one critical dimension and wherein the module controller is further configured to determine whether the measured at least one post process dimension is within a first predetermined range and the module controller is further configured to adjust the at least one implant or annealing processing tool of the implant-annealing process module upon determining that the measured at least one post process dimension is not within the first predetermined range.

12. The implant-anneallng process module of claim 11 wherein the at least one post process dimension is junction depth.

13. The implant-annealing process module of claim 11 wherein the module controller is further configured to adjust at least one parameter value to re-process the at least one of the plurality of wafers when the measured at least one post process dimension is not within the first predetermined range and configured to cause the at least one of the plurality of wafers to be sent to a next processing tool upon determining that the measured at least one post process dimension is within the first predetermined range.

14. The implant-annealing process module of claim 11 wherein the first metrology tool is further configured to measure a length of a gate of at least one device fabricated on the at least one of the plurality of wafers.

15. The implant-annealing process module of claim 11, wherein the at least one implant or annealing processing tool includes at least one implanter tool for implanting ions into a junction of said at least one device for at least reducing deviation in gate delay.

16. The implant-annealing process module of claim 15, wherein the at least one Implanting tool is a beamline type implanting tool.

17. The implant-annealing process module of claim 12, wherein the first predetermined range is plus or minus 10 percent from a respective target value.

18. The system of claim 15, wherein the at least one implanter tool processes one wafer at a time.

19. The system of claim 11, wherein the at least one implant or annealing processing tool includes at least one annealing tool for at least reducing deviation in gate delay.

20. The system of claim 19, wherein the annealing tool is controlled by parameters that include at least one of a Rapid Thermal Processing (RTP) peak temperature level and anneal time length.

21. A system of processing a plurality of wafers for manufacturing semiconductor devices, comprising:
means for forming at least one critical dimension on at least one device being fabricated on at least one of the plurality of wafers;
means for measuring the at least one critical dimension of the at least one device being fabricated on the at least one of the plurality of wafers after the at least one critical dimension has been formed, wherein the means for measuring the at least one critical dimension is in an implant-annealing process module and before the at least one of the plurality of wafers is processed by at least one implant or annealing processing tool of the implant-annealing process module, wherein a variation in the at least one critical dimension causes a variation in performance of the at least one device;
means for determining at least one control parameter value of the at least one implant or annealing processing tool based on the measured at least one critical dimension, wherein the at least one control parameter value is selected from the group that consists of a halo angle, a Source Drain-Extension (SDE) dose level, an energy and tilt level, a pocket implant dose level, and a channel and channel $V_T$ adjust implant dose level;
means for controlling the at least one implant or annealing processing tool of the implant-annealing process module to process the at least one of the plurality of wafers based on the at least one control parameter value;
means for measuring at least one post process dimension of the at least one of the plurality of wafers, wherein the at least one post process dimension is junction depth and is different from the at least one critical dimension;
means for determining whether the measured at least one post process dimension is within a first predetermined range; and
means for sending the at least one of the plurality of wafers to a processing tool upon determining that the measured at least one post process dimension is within the first predetermined range.

22. The system of claim 21 further comprising:
means for adjusting the at least one implant or annealing processing tool of the implant-annealing process module upon determining that the measured at least one post process dimension is not within the first predetermined range.

23. The system of claim 21 further comprising:
means for adjusting at least one parameter value to re-process the at least one of the plurality of wafers when the measured at least one post process dimension is not within the first predetermined range.

24. The system of claim 21 wherein the means for measuring at least one critical dimension comprises:
means for measuring a length of a gate on the one of the plurality of wafers.

25. The system of claim 21, wherein the at least one implant or annealing processing tool includes at least one implanter tool for implanting ions into a junction of said at least one device for at least reducing deviation in gate delay.

26. The system of claim 25, wherein the at least one implanting tool is a beamline type implanting tool.

27. The system of claim 22, wherein the first predetermined range is plus or minus 10 percent from a respective target value.

28. The system of claim 25, wherein the at least one implanter tool processes one wafer at a time.

29. The system of claim 21, wherein the at least one implant or annealing processing tool includes at least one annealing tool for at least reducing deviation in gate delay.

30. The system of claim 29, wherein the annealing tool is controlled by parameters that include at least one of a Rapid Thermal Processing (RTP) peak temperature level and anneal time length.

31. A computer-readable medium including instructions being executed by one or more computers, the instructions instructing the one or more computers and at least one metrology tool of an implant-annealing process module and at least one implant or annealing processing tool of the implant-annealing process module for processing a plurality of wafers for manufacturing semiconductor devices, the instructions comprising implementation of the sequential steps of:
(a) measuring at least one critical dimension of at least one device fabricated on at least one of the plurality of wafers by one of the at least one metrology tool of the implant-annealing process module, wherein a variation in the at least one critical dimension causes a variation in performance of the at least one device;
(b) determining at least one control parameter value of the at least one implant or annealing processing tool based on the measured at least one critical dimensions wherein the at least one control parameter value is selected from the group that consists of a halo angle, a Source Drain-Extension (SDE) dose level, an enemy and tilt level, a pocket implant dose level, and a channel and channel VT adjust implant dose level;
(c) controlling the at least one implant or annealing processing tool of the implant-annealing process module to process the at least one of the plurality of wafers based on the at least one control parameter value;
(d) measuring at least one post process dimensions of the at least one of the plurality of wafers by one of the at least one metrology tool of the implant-annealing process module, wherein the at least one post process dimension is junction depth and is different from the at least one critical dimension; and (e) determining whether the measured at least one post process dimension is within a first predetermined range.

32. The medium of claim 31 further comprising instructions to implement the step of:
(f) adjusting the at least one implant or annealing processing tool of the step (c) upon determining that the measured at least one post process dimension is not within the first predetermined range.

33. The medium of claim 31 further comprising instructions to implement the steps of:
(f) sending the at least one of the plurality of wafers to a next processing tool upon determining that the measured at least one past process dimension is within the first predetermined range; and
(g) adjusting the step (c) to re-process the at least one of the plurality of wafers when the measured at least one post process dimension is not within the first predetermined range.

34. The medium of claim 31 wherein step (a) comprises the step of:
measuring a length of a gate on the one of the plurality of wafers.

35. The medium of claim 31, wherein the at least one implant or annealing processing tool includes at least one implanter tool for implanting ions into a junction of said at least one device for at least reducing deviation in gate delay.

36. The medium of claim 35, wherein the at least one implanting tool is a beamline type implanting tool.

37. The medium of claim 31, wherein, in step (e), the first predetermined range is plus or minus 10 percent from a respective target value.

38. The medium of claim 35, wherein the at least one implanter tool processes one wafer at a time.

39. The medium of claim 31, wherein the at least one implant or annealing processing tool includes at least one annealing tool for at least reducing deviation in gate delay.

40. The medium of claim 39, wherein the annealing tool is controlled by parameters that include at least one of a Rapid Thermal Processing (RTP) peak temperature level and anneal time length.

41. A method of processing a plurality of wafers for manufacturing semiconductor devices, sequentially comprising:
(a) measuring at least one critical dimension of at least one device fabricated on at least one of the plurality of wafers by one of the at least one metrology tool of an implant-annealing process module, wherein a variation in the at least one critical dimension causes a variation in performance of the at least one device;
(b) determining at least one control parameter value of at least one implant or annealing processing tool of the implant-annealing process module based on the measured at least one critical dimension, wherein the at least one control parameter value is selected from the group that consists of a halo angle, a Source Drain-Extension (SDE) dose level, an enemy and tilt level, a pocket implant dose level, and a channel and channel $V_T$ adjust implant dose level;
(c) controlling the at least one implant or annealing processing tool of the implant-annealing process module to process the at least one of the plurality of wafers based on the at least one control parameter value;
(d) measuring at least one post process dimension of the at least one of the plurality of wafers by one of the at least one metrology tool of the implant-annealing process module, wherein the at least one post process dimension is junction depth and is different from the at least one critical dimension;
(e) determining whether the measured at least one post process dimension is within a first predetermined range;
(f) sending the at least one of the plurality of wafers to a next processing tool upon determining that the measured at least one post process dimension is within the first predetermined range; and
(g) adjusting the at least one implant or annealing processing tool upon determining that the measured at least one post process dimension is not within the first predetermined range, to thereby reduce deviation in gate delay.

42. A method of processing a plurality of wafers for manufacturing semiconductor devices, sequentially comprising:
(a) measuring at least one critical dimension of at least one device fabricated on at least one of the plurality of wafers by one of the at least one metrology tool of an implant-annealing process module, wherein a variation in the at least one critical dimension causes a variation in performance of the at least one device;
(b) determining at least one control parameter value of at least one implant or annealing processing tool of the implant-annealing process module based on the measured at least one critical dimension, wherein the at least one control parameter value is selected from the group that consists of a halo angle, a Source Drain-Extension (SDE) dose level, an enemy and tilt level, a pocket implant dose level, and a channel and channel $V_T$ adjust implant dose level;
(c) controlling the at least one implant or annealing processing tool of the implant-annealing process module to process the at least one of the plurality of wafers based on the at least one control parameter value;
(d) measuring at least one post process dimension of the at least one of the plurality of wafers by one of the at least one metrology tool of the implant-annealing process module, wherein the at least one post process dimension is junction depth and is different from the at least one critical dimension;
(e) determining whether the measured at least one post process dimension is within a first predetermined range; and
(f) re-processing the at least one of the plurality of wafers when the measured at least one post process dimension is not within the first predetermined range, to thereby reduce deviation in gate delay.

43. A semiconductor wafer processing system comprising:
a first metrology tool, of an implant-annealing process module, configured to measure at least one critical dimension of at least one device fabricated on at least one of a plurality of wafers, wherein a variation in the at least one critical dimension causes a variation in performance of the at least one device;
a module controller configured to determine at least one control parameter value based on the measured at least one critical dimension, wherein the at least one control parameter value is selected from the group that consists of a halo angle, a Source Drain-Extension (SDE) dose level, an energy and tilt level, a pocket implant dose level, and a channel and channel $V_T$ adjust implant dose level;
at least one implant or annealing processing tool, of the implant-annealing process module, configured to be controlled by the module controller in processing the at least one of the plurality of wafers based on the at least one control parameter value; and a second metrology tool, of the implant-annealing process module, configured to measure at least one post process dimension of the at least one of the plurality of wafers, wherein the at least one post process dimension is junction depth and is different from the at least one critical dimension;

wherein the module controller is further configured to determine whether the measured at least one post process dimension is within a first predetermined range, configured to cause the at least one of the plurality of wafers to be sent to a next processing tool upon determining that the measured at least one post process dimension is within the first predetermined range, and configured to adjust the at least one implant or annealing processing tool, of the implant-annealing process module, upon determining that the measured at least one post process dimension is not within the first predetermined range, to thereby reduce deviation in gate delay.

44. A semiconductor wafer processing system comprising:

a first metrology tool, of an implant-annealing process module, configured to measure at least one critical dimension of at least one device fabricated on at least one of a plurality of wafers, wherein a variation in the at least one critical dimension causes a variation in performance of the at least one device;

a module controller configured to determine at least one control parameter value based on the measured at least one critical dimension wherein the at least one control parameter value is selected from the group that consists of a halo angle, a Source Drain-Extension (SDE) dose level, an energy and tilt level, a pocket implant dose level, and a channel and channel $V_T$ adjust implant dose level; and a first implant or annealing processing tool, of an implant-annealing process module, configured to be controlled by the module controller in processing the at least one of the plurality of wafers based on the at least one control parameter value, wherein the module controller is further configured to collect measurement of at least one post process dimension of the at least one of a plurality of wafers, wherein the at least one post process dimension is junction depth and is different from the at least one critical dimension, configured to determine whether or not the measured at least one post process dimension is within a first predetermined range, and configured to adjust the at least one parameter value to re-process the one of at least one of the plurality of wafers when the measured at least one post process dimension is not within the first predetermined range to thereby reduce deviation in gate delay.

* * * * *

UNITED STATES PATENT AND TRADEMARK OFFICE
CERTIFICATE OF CORRECTION

| | | |
|---|---|---|
| PATENT NO. | : 7,225,047 B2 | Page 1 of 1 |
| APPLICATION NO. | : 10/100184 | |
| DATED | : May 29, 2007 | |
| INVENTOR(S) | : Al-Bayati et al. | |

It is certified that error appears in the above-identified patent and that said Letters Patent is hereby corrected as shown below:

In the Claims:

In Column 14, Claim 11, Line 42, please delete "enemy" and insert --energy--;

In Column 14, Claim 12, Line 58, please delete "implant-anneallng" and insert --implant-annealing--;

In Column 15, Claim 16, Line 13, please delete "Implanting" and insert --implanting--;

In Column 16, Claim 31, Line 52, please delete "dimensions" and insert --dimension,--;

In Column 16, Claim 31, Line 55, please delete "enemy" and insert --energy--;

In Column 17, Claim 33, Line 14, please delete "past" and insert --post--;

In Column 17, Claim 41, Line 57, please delete "enemy" and insert --energy--;

In Column 18, Claim 42, Line 30, please delete "enemy" and insert --energy--;

In Column 20, Claim 44, Line 3, please delete "dimension" and insert --dimension,--.

Signed and Sealed this

Thirty-first Day of July, 2007

JON W. DUDAS
*Director of the United States Patent and Trademark Office*